(12) United States Patent
Lee et al.

(10) Patent No.: US 11,696,436 B2
(45) Date of Patent: Jul. 4, 2023

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Ki Seok Lee, Hwaseong-si (KR); Jae Hyun Yoon, Suwon-si (KR); Kyu Jin Kim, Seoul (KR); Keun Nam Kim, Yongin-si (KR); Hui-Jung Kim, Seongnam-si (KR); Kyu Hyun Lee, Hwaseong-si (KR); Sang-Il Han, Seoul (KR); Sung Hee Han, Hwaseong-si (KR); Yoo Sang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/035,082

(22) Filed: Sep. 28, 2020

(65) Prior Publication Data

US 2021/0257374 A1 Aug. 19, 2021

(30) Foreign Application Priority Data

Feb. 18, 2020 (KR) ........................ 10-2020-0019561

(51) Int. Cl.
H10B 12/00 (2023.01)
(52) U.S. Cl.
CPC ........... *H10B 12/34* (2023.02); *H10B 12/053* (2023.02)

(58) Field of Classification Search
None
See application file for complete search history.

(56) References Cited

U.S. PATENT DOCUMENTS

| | | | |
|---|---|---|---|
| 8,610,191 B2 | 12/2013 | Moon et al. | |
| 9,117,759 B2 | 8/2015 | Sapra et al. | |
| 9,287,374 B2 | 3/2016 | Lee et al. | |
| 9,972,627 B2 | 5/2018 | Jang et al. | |
| 10,043,811 B1 | 8/2018 | Tsai et al. | |
| 10,211,086 B2 | 2/2019 | Nagai | |
| 10,319,726 B2 | 6/2019 | Nam et al. | |
| 11,004,854 B2 * | 5/2021 | Nam ................. | H01L 27/10855 |
| 2019/0221669 A1 | 7/2019 | Lee et al. | |

FOREIGN PATENT DOCUMENTS

| | | |
|---|---|---|
| KR | 10-1113794 | 2/2012 |
| KR | 10-1790075 | 10/2017 |

* cited by examiner

*Primary Examiner* — Hsien Ming Lee
(74) *Attorney, Agent, or Firm* — F. Chau & Associates, LLC

(57) ABSTRACT

A includes an element isolation region, a first active region bounded by the element isolation region and that extends in a first direction and includes first and second parts disposed at a first level, and a third part disposed at a second level located above the first level, and a gate electrode disposed inside each of the element isolation region and the first active region and that extends in a second direction different from the first direction. The second part is spaced apart in the first direction from the first part, and the third part contacts each of the first and second parts. A first width in the second direction of the first part is less than a second width in the second direction of the third part.

16 Claims, 35 Drawing Sheets

SEMICONDUCTOR DEVICE AND METHOD FOR FABRICATING THE SAME

This application claims priority under 35 U.S.C. § 119 from, and the benefit of, Korean Patent Application No. 10-2020-0019561, filed on Feb. 18, 2020 in the Korean Intellectual Property Office, the contents of which are herein incorporated by reference in their entirety.

BACKGROUND

1. Technical Field

Embodiments of the present disclosure are directed to a semiconductor device and a method for fabricating the same.

2. Discussion of the Related Art

A buried channel array transistor (BCAT) includes a gate electrode buried in a trench to overcome short channel effects of a DRAM structure.

On the other hand, as semiconductor elements become more and more highly integrated, individual circuit patterns are further miniaturized to implement more semiconductor elements in the same area. That is, the design rules of the constituent elements of the semiconductor element decrease. As DRAM devices also become integrated, an amount of charge that can be charged in a capacitor steadily decreases. Therefore, research is being conducted to increase the amount of stored charges in a capacitor and to reduce leakage.

SUMMARY

Embodiments of the present disclosure provide a semiconductor device and a method for fabricating the same in which reliability is improved, by increasing a horizontal width of an element isolation region in which a gate electrode is disposed, thereby reducing a negative influence between gate electrodes.

According to an exemplary embodiment of the present disclosure, there is provided a semiconductor device that includes an element isolation region, a first active region that is bounded by the element isolation region and extends in a first direction, where the first active region includes a first part and a second part that are disposed at a first level, and a third part disposed at a second level located above the first level, and a gate electrode disposed inside each of the element isolation region and the first active region and that extends in a second direction that differs from the first direction. The second part of the first active region is spaced apart in the first direction from the first part of the first active region, and the third part of the first active region contacts each of the first and second parts of the first active region. A first width in the second direction of the first part of the first active region is less than a second width in the second direction of the third part of the first active region.

According to an exemplary embodiment of the present disclosure, there is provided a semiconductor device that includes an element isolation region, a first active region that is bounded by the element isolation region and extends in a first direction, where the first active region includes a first part and a second part that are disposed at a first level, and a third part disposed at a second level located above the first level, and a second active region that is bounded by the element isolation region and extends in the first direction, where the second active region is spaced apart in a second direction from the first active region, where the second direction differs from the first direction, and the second active region includes a first part and a second part that are disposed at the first level, and a third part disposed at the second level. The second part of the first active region is spaced apart in the first direction from the first part of the first active region, and the third part of the first active region contacts each of the first and second parts of the first active region. The second part of the second active region is spaced apart in the first direction from the first part of the second active region, and the third part of the second active region contacts each of the first and second parts of the second active region. A first width in the second direction of the element isolation region between the first part of the first active region and the second part of the second active region is greater than a second width in the second direction of the element isolation region between the third part of the first active region and the third part of the second active region.

According to an exemplary embodiment of the present disclosure, there is provided a method for fabricating a semiconductor device that includes forming a first trench that defines an active region on a substrate, forming a first insulating film along side walls and a bottom surface of the first trench, forming a sacrificial film on the first insulating film that partially fills the first trench, forming a second insulating film on the sacrificial film and along the side walls of the first insulating film, removing portions of the second insulating film, the sacrificial film, and the first insulating film that are formed on the side walls and the bottom surface of the sacrificial film to expose a lower part of the first trench, etching the exposed the side walls and the bottom surface of the first trench to form a second trench, forming an element isolation region that fills an inside of each of the first trench and the second trench, and forming a gate electrode that extends in a first direction inside each of the active region and the element isolation region.

According to an exemplary embodiment of the present disclosure, there is provided a semiconductor device that includes an element isolation region; and a first active region that is bounded by the element isolation region and extends in a first direction, wherein the first active region includes a first part and a second part, each disposed at a first level, and a third part disposed at a second level located above the first level. The second part of the first active region is spaced apart in the first direction from the first part of the first active region, and the third part of the first active region contacts each of the first part and the second part of the first active region. A first width in a second direction of the first part of the first active region is less than a second width in the second direction of the third part of the first active region, where the second direction differs from the first direction. The first part of the first active region is spaced apart in the second direction from a first side wall of the third part of the first active region, and the second part of the first active region is spaced apart in the second direction from a second side wall of the third part opposite to the first side wall of the third part of the first active region.

BRIEF DESCRIPTION OF THE DRAWINGS

FIG. 9 is a layout diagram at a third level that illustrates a semiconductor device according to other embodiments of the present disclosure, and.

DETAILED DESCRIPTION OF EXEMPLARY EMBODIMENTS

Figure 1:
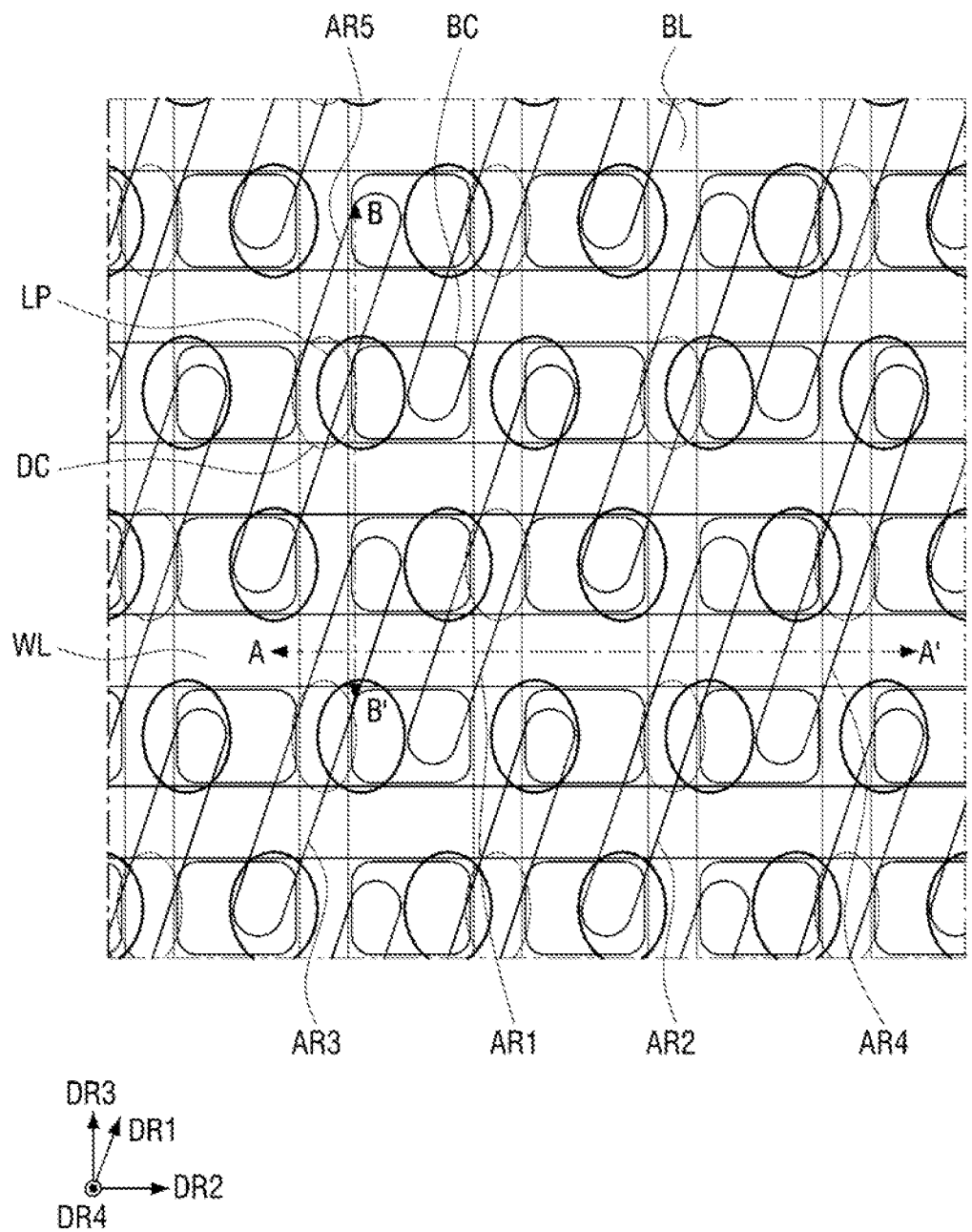
FIG. 1 is a layout diagram of a semiconductor device according to some embodiments of the present disclosure.

Hereinafter, a semiconductor device according to some embodiments of the present disclosure will be described with reference to FIGS. 1 through 5. In the drawings, the same or similar reference numbers may indicate the same components throughout the specification.

Figure 2:
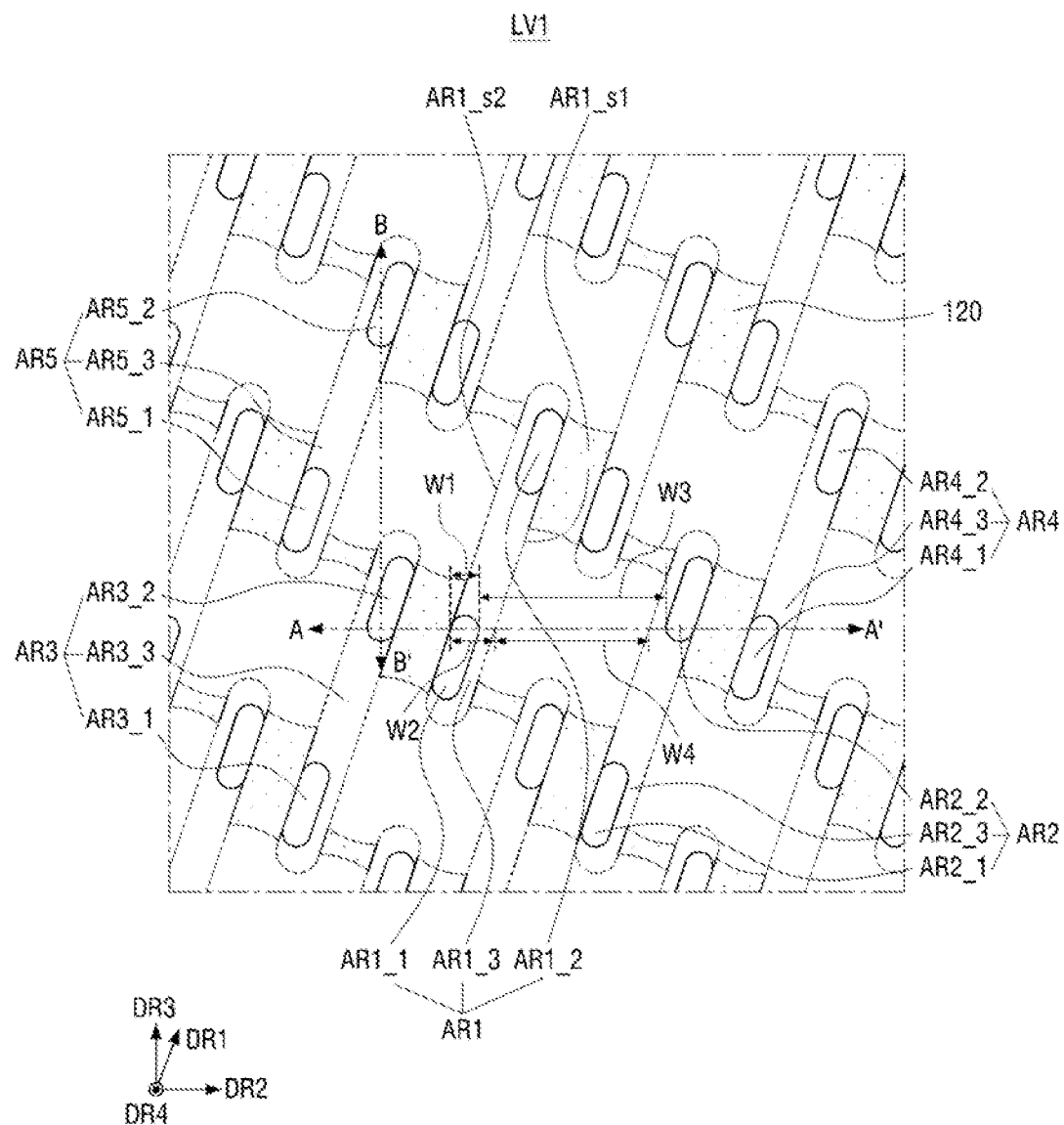
FIG. 2 is a layout diagram of a first level of the semiconductor device according to some embodiments of the present disclosure.
Figure 3:
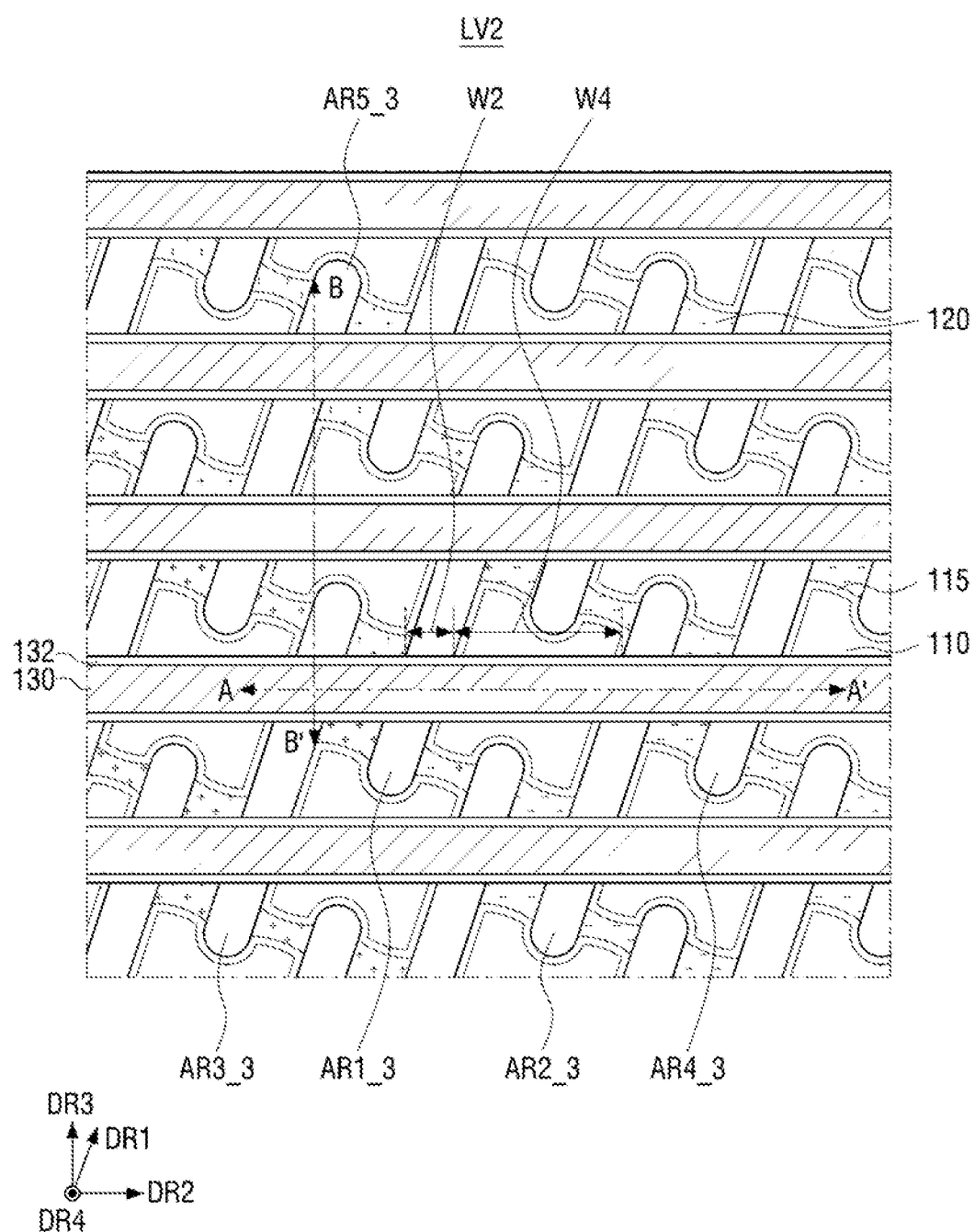
FIG. 3 is a layout diagram of a second level of the semiconductor device according to some embodiments of the present disclosure.
Figure 4:
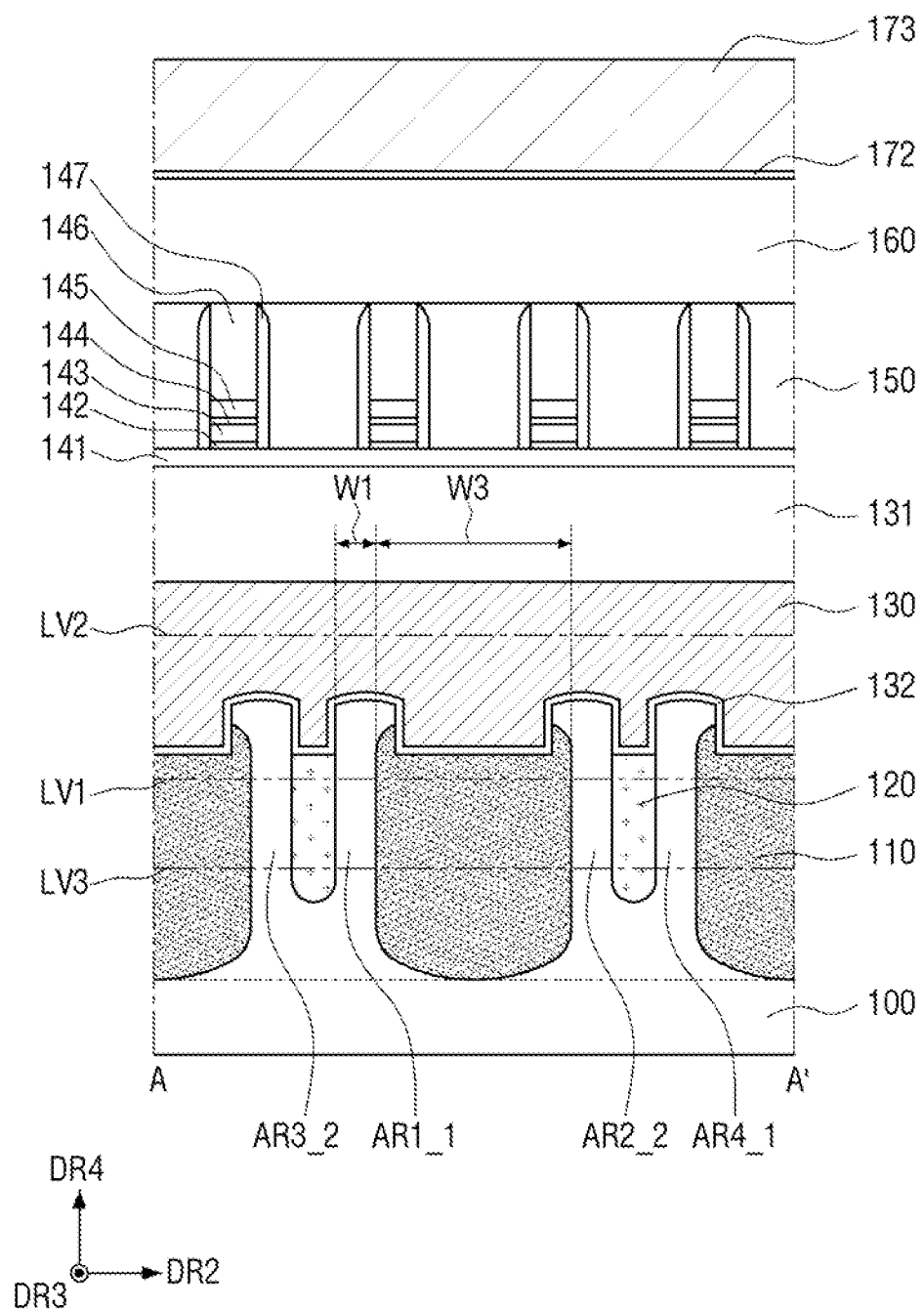
FIG. 4 is a cross-sectional view taken along a line A-A' of FIGS. 1 to 3.
Figure 5:
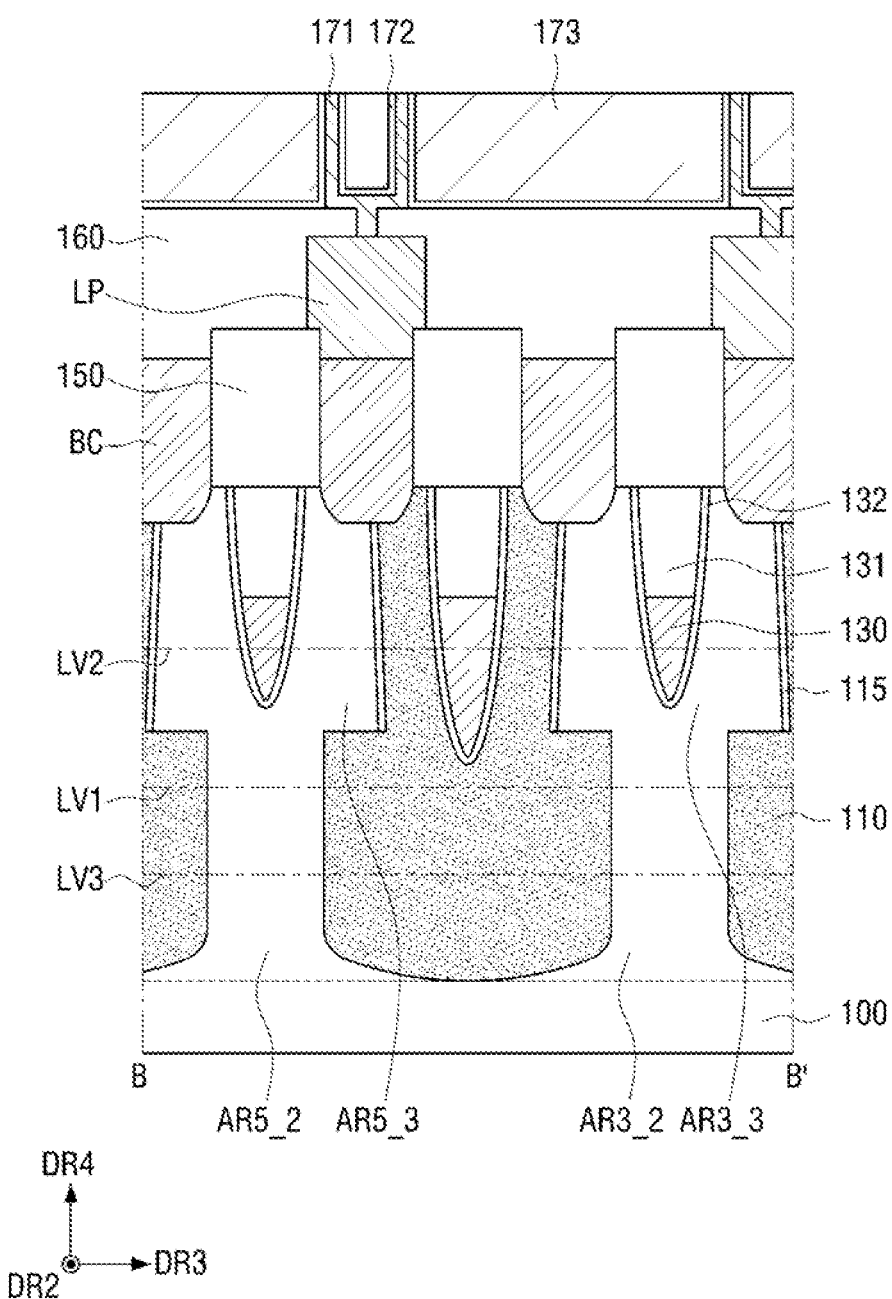
FIG. 5 is a cross-sectional view taken along a line B-B' of FIGS. 1 to 3.

FIG. 1 is a layout diagram of a semiconductor device according to some embodiments of the present disclosure. FIG. 2 is a layout diagram of a first level of a semiconductor device according to some embodiments of the present disclosure, FIG. 3 is a layout diagram of a second level of a semiconductor device according to some embodiments of the present disclosure. FIG. 4 is a cross-sectional view taken along a line A-A' of FIGS. 1 to 3. FIG. 5 is a cross-sectional view taken along a line B-B' of FIGS. 1 to 3.

Referring to FIG. 1, a semiconductor device according to some embodiments of the present disclosure includes a plurality of active regions ARi, where i is a positive integer. Each of the plurality of active regions is disposed on a substrate 100, as shown in FIG. 4. Each of the plurality of active regions is bounded by a first element isolation region 110, shown in FIG. 4, and a second element isolation region 120, shown in FIG. 4. Each of the plurality of active regions extends in a first direction DR1.

According to some embodiments, with the decrease in the design rule of a semiconductor device, as shown in FIG. 1, each of the plurality of active regions has a bar shape along a diagonal or oblique line.

According to some embodiments, the plurality of active regions include, for example, first to fifth active regions AR1 to AR5. The third active region AR3, the first active region AR1, the second active region AR2, and the fourth active region AR4 are sequentially spaced apart from each other in a second direction DR2 that differs from the first direction DR1. The fifth active region AR5 is spaced apart from the third active region AR3 in a third direction DR3 that is perpendicular to the second direction DR2.

According to some embodiments, the third active region AR3 and the second active region AR2 are spaced apart in the second direction DR2. The first active region AR1 and the fourth active region AR4 are spaced apart in the second direction DR2. The third active region AR3 and the fifth active region AR5 are spaced apart in the third direction DR3.

According to some embodiments, a plurality of gate electrodes 130, shown in FIG. 4, are disposed on the plurality of active regions and extend across each of the plurality of active regions. The plurality of gate electrodes 130 extend parallel to each other in the second direction DR2. The plurality of gate electrodes 130 may be, for example, a plurality of word lines WL.

According to some embodiments, the word lines WL are spaced apart by a same interval. A width of the word lines WL or an interval between the word lines WL is determined by the design rules.

According to some embodiments, a plurality of bit lines BL that extend in the third direction DR3 orthogonal to the second direction are on the word lines WL. The plurality of bit lines BL extend parallel to each other in the third direction DR3.

According to some embodiments, the bit lines BL are spaced apart by a same interval. A width of the bit lines BL or an interval between the bit lines BL is determined by the design rules.

A semiconductor device according to some embodiments of the present disclosure includes various contact arrangements disposed on a plurality of active regions. The various contact arrangements may include, for example, a direct contact DC, a buried contact BC, a landing pad LP, etc.

According to some embodiments, a direct contact DC means a contact that electrically connects each of the plurality of active regions to the bit line BL. A buried contact BC means a contact that connects a plurality of active regions to a lower electrode 171, shown in FIG. 5. of the capacitor.

In view of the arrangement, a contact area between the buried contact BC and each of the plurality of active regions is small. Accordingly, in some embodiments, a conductive landing pad LP is disposed to enlarge the contact area with each of the plurality of active regions and enlarge the contact area with the lower electrode 171 of the capacitor.

According to some embodiments, the landing pad LP is disposed between each of the plurality of active regions and the buried contact BC, and is disposed between the buried contact BC and the lower electrode 171 of the capacitor. In a semiconductor device according to some embodiments of the present disclosure, the landing pad LP is disposed between the buried contact BC and the lower electrode 171 of the capacitor. By enlarging the contact area through introduction of the landing pad LP, the contact area between each of the plurality of active regions and the lower electrode 171 of the capacitor increases.

In a semiconductor device according to some embodiments of the present disclosure, a direct contact DC is disposed at a central portion of each of the plurality of active regions. The buried contacts BC are disposed at both end portions of each of the plurality of active regions.

According to some embodiments, as the buried contacts BC are disposed at both end portions of each of the plurality of active regions, the landing pad LP is disposed adjacent to both ends of each of the plurality of active regions and partially overlaps the buried contacts BC.

In other words, according to some embodiments, the buried contact BC overlaps each of a plurality of active regions and the first and second element isolation regions 110 and 120 that are located between adjacent word lines WL and between adjacent bit lines BL.

According to some embodiments, the word line WL are a structure buried in the substrate 100. The word line WL are disposed across each of the plurality of active regions between the direct contacts DC or the buried contacts BC.

As shown in FIG. 1, according to some embodiments, two word lines WL can cross a single active region. Since each of the plurality of active regions has an oblique form, the word line WL forms an angle with each of the plurality of active regions that is less than 90 degrees.

According to some embodiments, the direct contact DC and the buried contact BC are symmetrically disposed. Accordingly, the direct contact DC and the buried contact BC are disposed in straight lines along the second direction DR2 and the third direction DR3. The landing pads LP are disposed in a zigzag pattern that extends in the third direction DR3 and oscillates in the second direction DR2.

Referring to FIGS. 2 to 5, a semiconductor device according to some embodiments of the present disclosure includes a substrate 100, first to fifth active regions AR1 to AR5, a first element isolation region 110, an oxide film 115, a second element isolation region 120, a gate electrode 130, a gate capping pattern 131, a gate insulating film 132, a first cell insulating film 141, a second cell insulating film 142, a first wiring conductive film 143, a second wiring conductive film 144, a third wiring conductive film 145, a wiring capping pattern 146, a wiring spacer 147, a first interlayer insulating film 150, a second interlayer insulating film 160, a lower electrode 171, a capacitor dielectric film 172 and an upper electrode 173.

According to some embodiments, the substrate 100 is a bulk silicon or a SOI (silicon-on-insulator) substrate. Alternatively, in other embodiments, the substrate 100 is a silicon substrate or includes, but is not limited to, other materials, such as silicon germanium, silicon germanium on insulator (SGOI), indium antimonide, lead telluride, indium arsenide, phosphide indium, gallium arsenide or gallium antimonide. Hereinafter, the substrate 100 will be described as being a silicon substrate.

According to some embodiments, the first to fifth active regions AR1 to AR5 are bounded by the first and second element isolation regions 110 and 120.

According to some embodiments, the first active region AR1 extends in the first direction DR1. The first active region AR1 includes a first part AR1_1 and a second part AR1_2 disposed at a first level LV1, and a third part AR1_3 disposed at a second level LV2 that is located on the first level LV1. The first and second levels LV1 and LV2 are indicated by dot-dashed lines in the figures.

According to some embodiments, the first part AR1_1 of the first active region AR1 is spaced apart in the first direction DR1 from the second part AR1_2 of the first active region AR1. The third part AR1_3 of the first active region AR1 contacts each of the first and second parts AR1_1 and AR1_2 of the first active region AR1.

According to some embodiments, a first width W1 in the second direction DR2 of the first part AR1_1 of the first active region AR1 may be less than a second width W2 of the third part AR1_3 of the first active region AR1 in the second direction DR2.

According to some embodiments, the third part AR1_3 of the first active region AR1 includes a first side wall AR1_$s1$, and a second side wall AR_$s2$ opposite to the first side wall AR1_$s1$. The first part AR1_1 is spaced apart in the second direction DR2 from the first side wall AR1_$s1$ of the third part AR1_3. The second part AR1_2 is spaced apart in the second direction DR2 from the second side wall AR1_$s2$ of the third part AR1_3. In other words, the first part AR1_1 and the second part are offset from each other in a direction perpendicular to the first direction DR1.

According to some embodiments, each of the second to fifth active regions AR2 to AR5 has a structure similar to that of the first active region AR1.

According to some embodiments, the second active region AR2 extends in the first direction DR1 and is spaced apart in the second direction DR2 from the first active region AR1. The second active region AR2 includes a first part AR2_1 and a second part AR2_2 disposed at the first level LV1, and a third part AR2_3 disposed at the second level LV2.

According to some embodiments, the first part AR2_1 of the second active region AR2 is spaced apart in the first direction DR1 from the second part AR2_2 of the second active region AR2. The third part AR2_3 of the second active region AR2 contacts each of the first and second parts AR2_1 and AR2_2 of the second active region AR2.

According to some embodiments, the third active region AR3 extends in the first direction DR1 and is spaced apart in the second direction DR2 from the first active region AR1. The first active region AR1 is disposed between the second active region AR2 and the third active region AR3. The third active region AR3 includes a first part AR3_1 and a second part AR3_2 disposed at the first level LV1, and a third part AR33 disposed at the second level LV2.

According to some embodiments, the first part AR3_1 of the third active region AR3 is spaced apart in the first direction DR1 from the second part AR3_2 of the third active region AR3. The third part AR3_3 of the third active region AR3 contacts each of the first and second parts AR3_1 and AR3_2 of the third active region AR3.

According to some embodiments, the fourth active region AR4 extends in the first direction DR1 and may be spaced apart in the second direction DR2 from the second active region AR2. The fourth active region AR4 includes a first part AR4_1 and a second part AR4_2 disposed at the first level LV1, and a third part AR4_3 disposed at a second level LV2.

According to some embodiments, the first part AR4_1 of the fourth active region AR4 is spaced apart in the first direction DR1 from the second part AR4_2 of the fourth active region AR4. The third part AR4_3 of the fourth active region AR4 contacts each of the first and second parts AR4_1 and AR4_2 of the fourth active region AR4.

According to some embodiments, the fifth active region AR5 extends in the first direction DR1 and is spaced apart in the third direction DR3 from the third active region AR3. The fifth active region AR5 includes a first part AR5_I and a second part AR5_2 disposed at the first level LV1, and a third part AR5_3 disposed at the second level LV2.

According to some embodiments, the first part AR5_1 of the fifth active region AR5 is spaced apart in the first direction DR1 from the second part AR5_2 of the fifth active region AR5. The third part AR5_3 of the fifth active region AR5 contacts each of the first and second parts AR5_1 and AR5_2 of the fifth active region AR5.

According to some embodiments, a third width W3 in the second direction DR2 between the first part AR1_1 of the first active region AR1 and the second part AR2_2 of the second active region AR2 is greater than a fourth width W4 in the second direction DR2 between the third part AR1_3 of the first active region AR1 and the third part AR2_3 of the second active region AR2.

According to some embodiments, a second element isolation region 120 is disposed between adjacent active regions. For example, the second element isolation region 120 is disposed between the third active region AR3 and the first active region AR1, and between the second active region AR2 and the fourth active region AR4.

According to some embodiments, the first element isolation region 110 surrounds the plurality of active regions and the second element isolation region 120.

For example, according to some embodiments, the first element isolation region 110 can surround the side walls of the third part AR1_3 of the first active region AR1. Further, the first element isolation region 110 surrounds each side wall of the first and second parts AR1_1 and AR1_2 of the first active region AR1. The first element isolation region 110 is disposed between the first and second parts AR1_1 and AR1_2 of the first active region AR1. That is, the first element isolation region 110 is disposed below a portion of the third part AR1_3 of the first active region AR1 that does not overlap each of the first and second parts AR1_1 and AR1_2 of the first active region AR1. In addition, the first element isolation region 110 extends in the fourth direction to partially cover side walls of the gate insulating film 132.

Similarly, according to some embodiments, the first element isolation region 110 surrounds the side walls of the second to fifth active regions AR2 to AR5.

According to some embodiments, a third width W3 in the second direction DR2 of the first element isolation region 110 between the first part AR1_1 of the first active region AR1 and the second part AR2_2 of the second active region AR2 is greater than a fourth width W4 in the second direction DR2 of the first element isolation region 110 between the third part AR1_3 of the first active region AR1 and the third part AR2_3 of the second active region AR2.

Although each of the first and second element isolation regions 110 and 120 may include at least one of a silicon oxide film, a silicon nitride film, or a silicon oxynitride film, embodiments of the present disclosure are not limited thereto. In a semiconductor device according to some embodiments of the present disclosure, each of the first and second element isolation regions 110 and 120 will be described as including a silicon oxide film.

According to some embodiments, the oxide film 115 is disposed to surround the side walls of the first element isolation region 110 at a level in which the third part AR13 of the first active region AR1 is disposed.

The oxide film 115 may include, for example, silicon oxide. According to some embodiments, the oxide film 115 includes the same material as the first element isolation region 110. However, embodiments of the present disclosure are not limited thereto.

According to some embodiments, the gate electrode 130 is disposed inside the first element isolation region 110, the second element isolation region 120, and each of the plurality of active regions. For example, the gate electrode 130 can be disposed inside each of the first element isolation region 110, the second element isolation region 120, the third part AR1_3 of the first active region AR1, the third part AR2_3 of the second active region AR2, the third part AR3_3 of the third active region AR3, the third part AR4_3 of the fourth active region AR4, and the third part AR5_3 of the fifth active region AR5.

According to some embodiments, the gate electrode 130 extends in the second direction DR2 across each of the plurality of active regions. The gate electrode 130 corresponds to the word line WL of FIG. 1.

According to some embodiments, the gate electrode 130 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAN), tungsten nitride (WN), ruthenium (Ru), titanium aluminum (TiA), titanium aluminum carbonitride (TiAC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or combinations thereof.

According to some embodiments, the gate capping pattern 131 is disposed on the gate electrode 130. The gate capping pattern 131 may include, for example, at least one of silicon nitride (SiN), silicon oxynitride (SiON), silicon oxide (SiO$_2$), silicon carbonitride (SiCN), or silicon oxycarbonitride (SiOCN), or combinations thereof.

According to some embodiments, the gate insulating film 132 is disposed along a side wall and a bottom surface of each of the gate electrode 130 and the gate capping pattern 131.

According to some embodiments, the gate insulating film 132 may include, for example, at least one of silicon oxide, silicon nitride, silicon oxynitride or a high dielectric constant material that has a dielectric constant greater than that of silicon oxide. The high dielectric constant material may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or combinations thereof.

According to some embodiments, each of the gate electrode 130, the gate capping pattern 131, and the gate insulating film 132 are buried in each of the first element isolation region 110, the second element isolation region 120, and the plurality of active regions.

According to some embodiments, a bit line structure includes a second cell insulating film 142, a first wiring conductive film 143, a second wiring conductive film 144, a third wiring conductive film 145, a wiring capping pattern 146 and a wiring spacer 147.

According to some embodiments, each of the plurality of bit line structures extends in the third direction DR3 on each of the first element isolation region 110, the second element isolation region 120, and the plurality of active regions. The plurality of bit line structures are spaced apart from each other in the second direction DR2.

In the cross-section shown in FIG. 4, according to some embodiments, a first cell insulating film 141 is disposed between each of the plurality of bit line structures and the gate capping pattern 131. Although FIG. 4 shows that the first cell insulating film 141 is formed on the entire upper surface of the gate capping pattern 131, embodiments of the present disclosure are not limited thereto.

According to some embodiments, the first cell insulating film 141 includes at least one of silicon oxide or silicon nitride. Although FIG. 4 shows that the first cell insulating film 141 is a single film, embodiments of the present disclosure are not limited thereto.

According to some embodiments, the second cell insulating film 142 extends in the third direction DR3 on the first cell insulating film 141. The second cell insulating film 142 includes a material having a dielectric constant that is less than that of the first cell insulating film 141. The second cell insulating film 142 may include, for example, silicon oxide.

According to some embodiments, the first to third wiring conductive films 143, 144 and 145 are sequentially stacked on the second cell insulating film 142. Each of the first to third wiring conductive films 143, 144 and 145 extends in the third direction DR3.

According to some embodiments, the first to third wiring conductive films 143, 144 and 145 correspond to the bit lines BL of FIG. 1.

According to some embodiments, each of the first to third wiring conductive films 143, 144 and 145 includes, for example, at least one of a semiconductor material doped with impurities, a conductive silicide compound, a conductive metal nitride, or a metal. For example, the first wiring conductive film 143 may include a doped semiconductor material, the second wiring conductive film 144 may include a conductive silicide compound, and the third wiring conductive film 145 may include at least one of a conductive metal nitride or a metal. However, embodiments of the present disclosure are not limited thereto.

According to some embodiments, the wiring capping pattern 146 extends in the third direction DR3 on the third wiring conductive film 145. Although the wiring capping pattern 146 may include silicon nitride, embodiments of the present disclosure are not limited thereto.

According to some embodiments, the wiring spacer 147 is disposed on both side walls of the second cell insulating film 142, the first to third wiring conductive films 143, 144 and 145, and the wiring capping pattern 146. The wiring spacer 147 extends in the third direction DR3.

According to some embodiments, the first interlayer insulating film 150 is disposed on each of the first element isolation region 110, the second element isolation region 120, and the plurality of active regions. The first interlayer insulating film 150 overlaps the gate electrode 130. The first interlayer insulating film 150 extends in the second direction DR2.

Although FIG. 4 shows that an upper surface of the first interlayer insulating film 150 is formed on a same plane as an upper surface of the wiring capping pattern 146, embodiments of the present disclosure are not limited thereto. That is, in other embodiments, the upper surface of the first interlayer insulating film 150 is lower than the upper surface of the wiring capping pattern 146.

According to some embodiments, the first interlayer insulating film 150 includes, for example, at least one of silicon oxide, silicon nitride, or silicon oxynitride, or combinations thereof.

According to some embodiments, the buried contacts BC are located between adjacent gate electrodes 130 and between adjacent bit line structures. The side walls of the buried contacts BC are surrounded by the first interlayer insulating film 150.

According to some embodiments, the buried contact BC includes, for example, at least one of a semiconductor material doped with impurities, a conductive silicide compound, a conductive metal nitride, or a metal.

According to some embodiments, the landing pad LP is disposed on the buried contact BC. The landing pad LP is electrically connected to the buried contact BC. The landing pad LP overlaps a part of the upper surface of the bit line structure. However, embodiments of the present disclosure are not limited thereto.

According to some embodiments, the landing pad LP includes, for example, at least one of a semiconductor material doped with impurities, a conductive silicide compound, a conductive metal nitride, or a metal.

According to some embodiments, the second interlayer insulating film 160 is disposed on the landing pad LP, the bit line structure, and the first interlayer insulating film 150. The second interlayer insulating film 160 defines a region of the landing pad LP that forms a plurality of isolation regions. Further, the second interlayer insulating film 160 can be patterned to expose a part of the upper surface of the landing pad LP.

According to some embodiments, the lower electrode 171 extends in the fourth direction DR4. The lower electrode 171 has a hollow cylindrical shape whose cross section is shown in FIG. 5. The lower electrode 171 may include, for example, a doped semiconductor material, a conductive metal nitride such as, titanium nitride, tantalum nitride, or tungsten nitride, etc., a metal such as ruthenium, iridium, titanium or tantalum, etc., or a conductive metal oxide such as iridium oxide, etc., embodiments of the present disclosure are not limited thereto.

According to some embodiments, the capacitor dielectric film 172 is disposed on the lower electrode 171 and the second interlayer insulating film 160. The capacitor dielectric film 172 is disposed along the upper surface of the second interlayer insulating film 160, and side walls and an upper surface of the lower electrode 171.

The capacitor dielectric film 172 may include, for example, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or combinations thereof, embodiments of the present disclosure are not limited thereto.

According to some embodiments, the upper electrode 173 is disposed on the capacitor dielectric film 172. The upper electrode 173 completely covers the capacitor dielectric film 172. The upper electrode 173 may include, for example, at least one of a doped semiconductor material, a metal, a conductive metal nitride, or a metal silicide.

According to some embodiments, the capacitor dielectric film 172 is disposed between the lower electrode 171 and the upper electrode 173. The capacitor stores charge in the capacitor dielectric film 172, using a potential difference that occurs between the lower electrode 171 and the upper electrode 173.

According to some embodiments, the lower electrode 171 has a hollow cylindrical shape, however, embodiments of the present disclosure are not limited thereto. That is, in other embodiments, the lower electrode 171 has a solid pillar shape.

In a semiconductor device according to some embodiments of the present disclosure, the reliability of the semiconductor device can be improved, by increasing the horizontal width of the first element isolation region 110 in which the gate electrode 130 is disposed, thereby reducing a negative influence between the gate electrodes 130.

Hereinafter, a semiconductor device according to other embodiments of the present disclosure will be described with reference to FIG. 6. The description will focus on differences from semiconductor devices shown in FIGS. 2 to 5.

Figure 6:
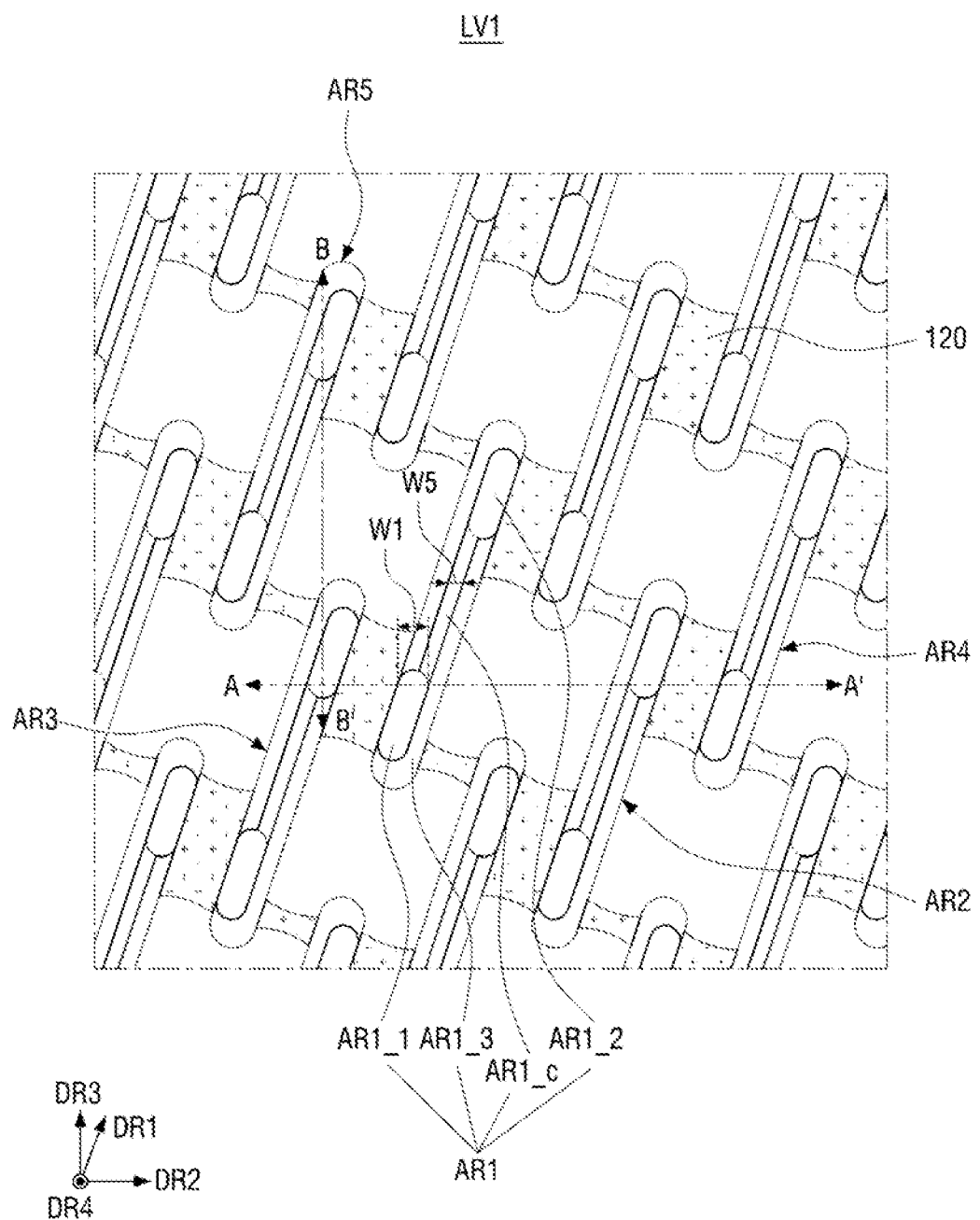
FIG. 6 is a layout diagram at the first level that illustrates a semiconductor device according to other embodiments of the present disclosure.

FIG. 6 is a layout diagram at a first level that illustrates a semiconductor device according to other embodiments of the present disclosure.

Referring to FIG. 6, a semiconductor device according to other embodiments of the present disclosure includes a connection part in each of a plurality of active regions disposed at a first level LV1.

For example, according to some embodiments, the first active region AR1 includes a connection part AR1_c that connects the first part AR1_1 of the first active region AR1 and the second part AR1_2 of the first active region AR1.

According to some embodiments, the connection part AR1_c of the first active region AR1 is disposed at the first level LV1. The connection part AR1_c extends in the first direction DR1. The connection part AR1_c contacts side walls of each of the first and second parts AR1_1 and AR1_2 of the first active region AR. Further, the connection part AR1_c contacts the third part AR1_3 of the first active region AR1.

According to some embodiments, the first width W1 in the second direction DR2 of the first part AR1_1 of the first active region AR is greater than the fifth width W5 in the second direction DR2 of the connection part AR1_c of the first active region AR.

According to some embodiments, each of the second to fifth active regions AR2 to AR5 has a structure similar to that of the first active region AR1.

Hereinafter, semiconductor devices according to other embodiments of the present disclosure will be described with reference to FIGS. 7 and 8. The description will focus on differences from semiconductor devices shown in FIGS. 2 to 5.

Figure 7:
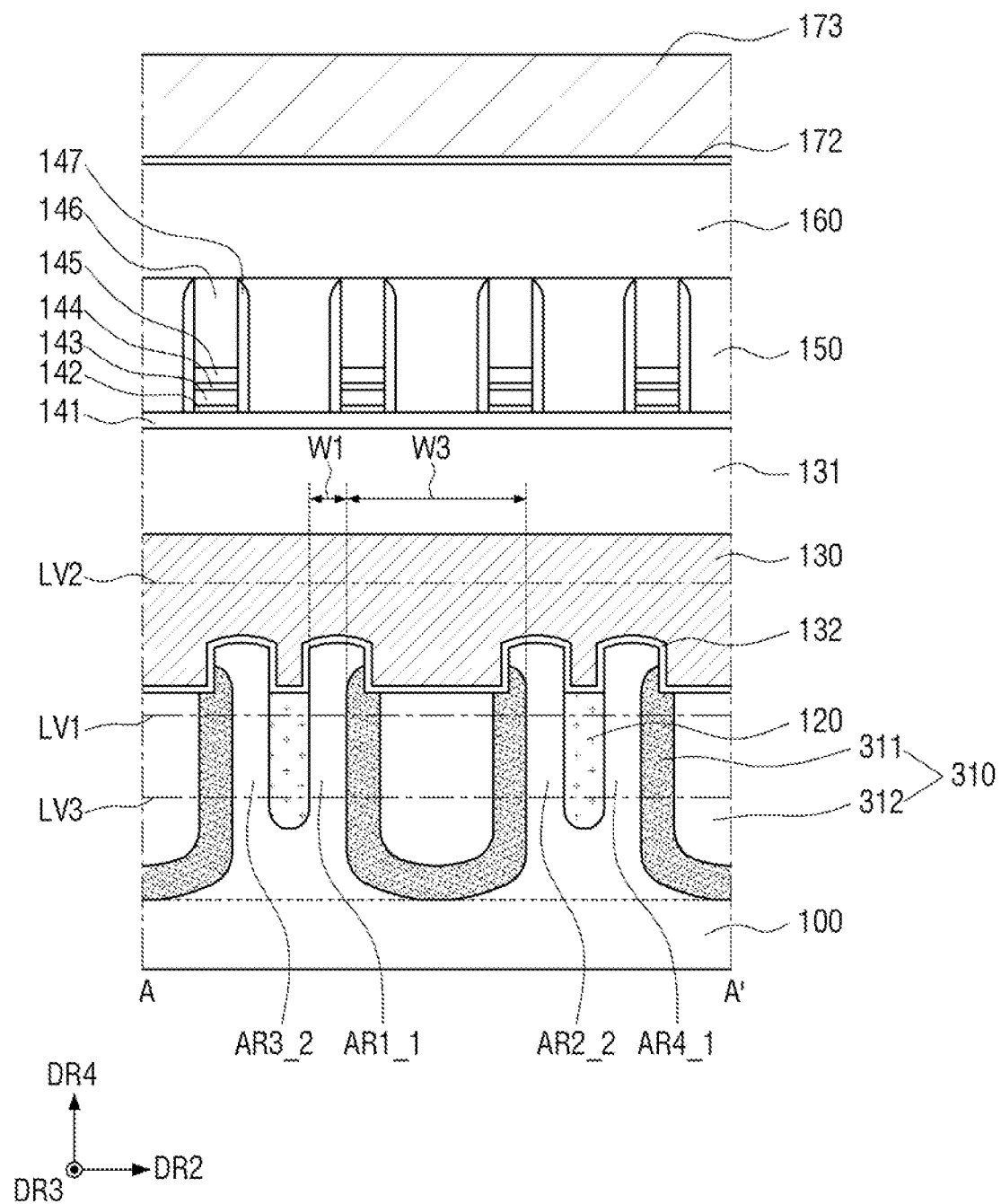
FIGS. 7 and 8 are cross-sectional views that illustrate a semiconductor device according to other embodiments of the present disclosure.
Figure 8:
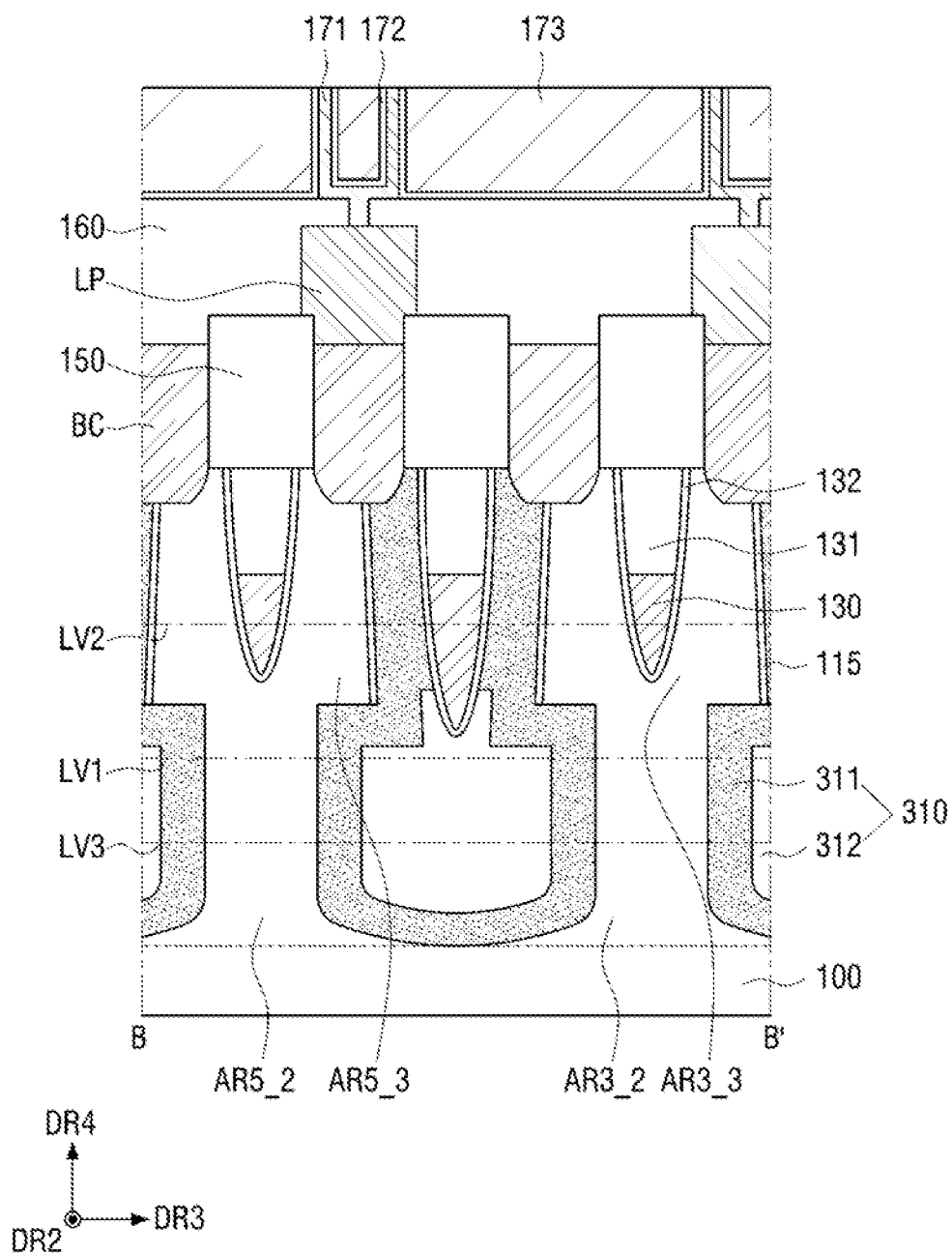

FIGS. 7 and 8 are cross-sectional views that illustrate a semiconductor device according to other embodiments of the present disclosure.

Referring to FIGS. 7 and 8, in a semiconductor device according to other embodiments of the present disclosure, a first element isolation region 310 is formed of a double film.

According to some embodiments, the first element isolation region 310 includes a first film 311 and a second film 312 disposed inside the first film. The first film 311 and the second film 312 include materials that differ from each other. The first film 311 may include, for example, silicon oxide. The second film 312 may include, for example, silicon nitride.

According to some embodiments, the second film 312 surrounds a part of a lower part of the gate electrode 130. However, embodiments of the present disclosure are not limited thereto.

Figure 10:
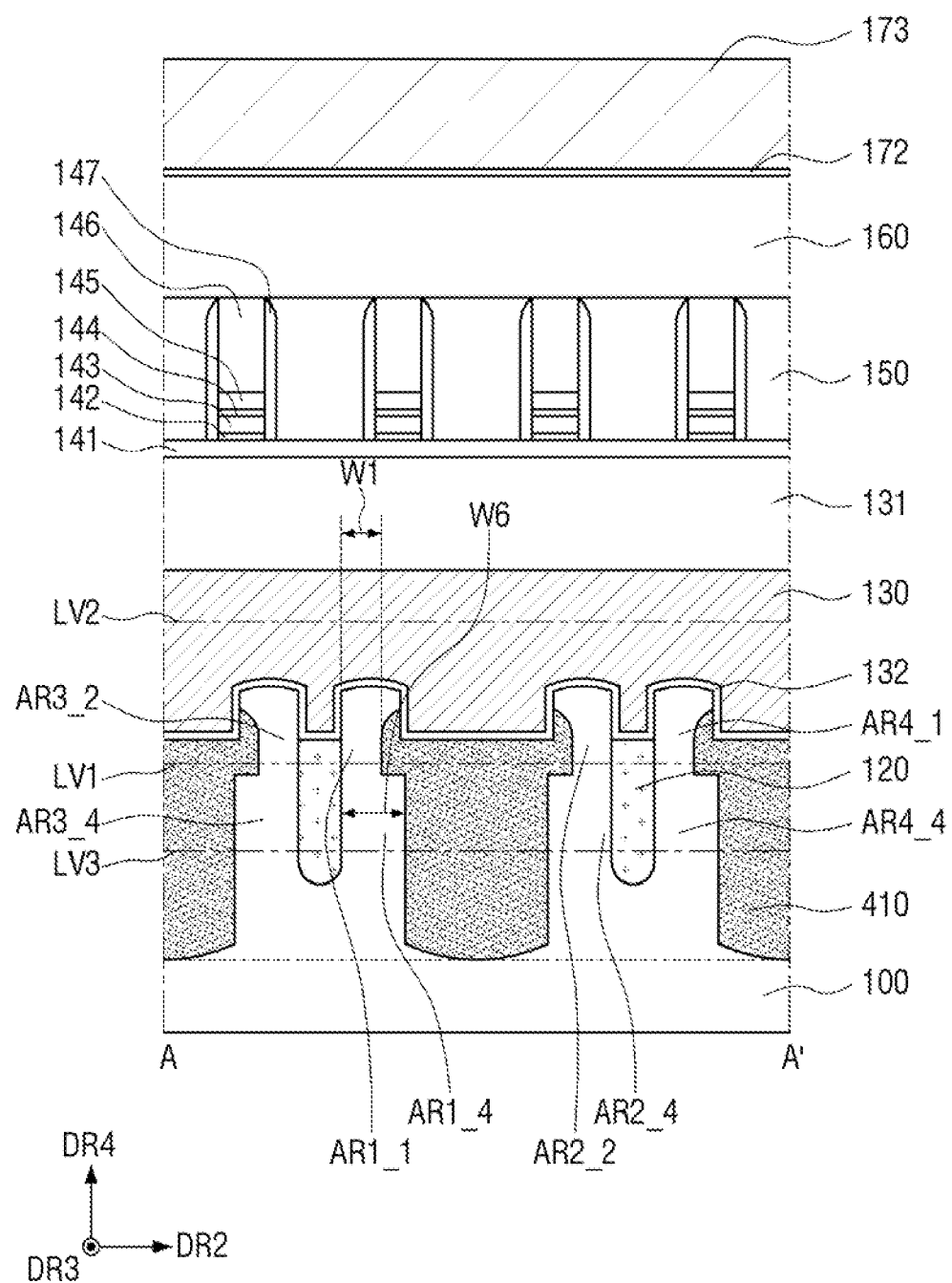
FIGS. 10 and 11 are cross-sectional views taken along a line A-A' and a line B-B' of FIG. 9, respectively.
Figure 11:
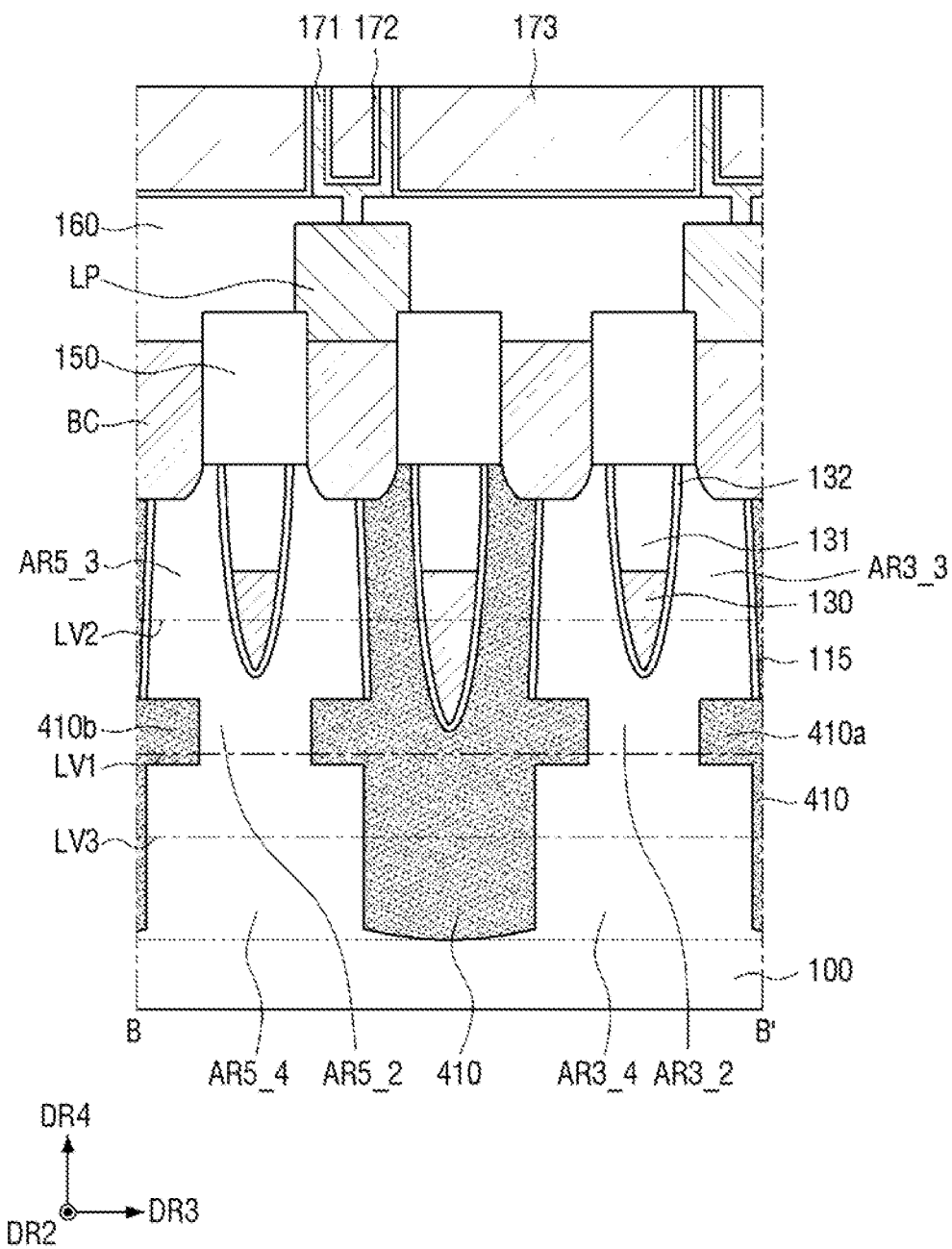

Hereinafter, the semiconductor device according to other embodiments of the present disclosure will be described with reference to FIGS. 9 to 11. The description will focus on differences from semiconductor devices shown in FIGS. 2 to 5.

Figure 9:
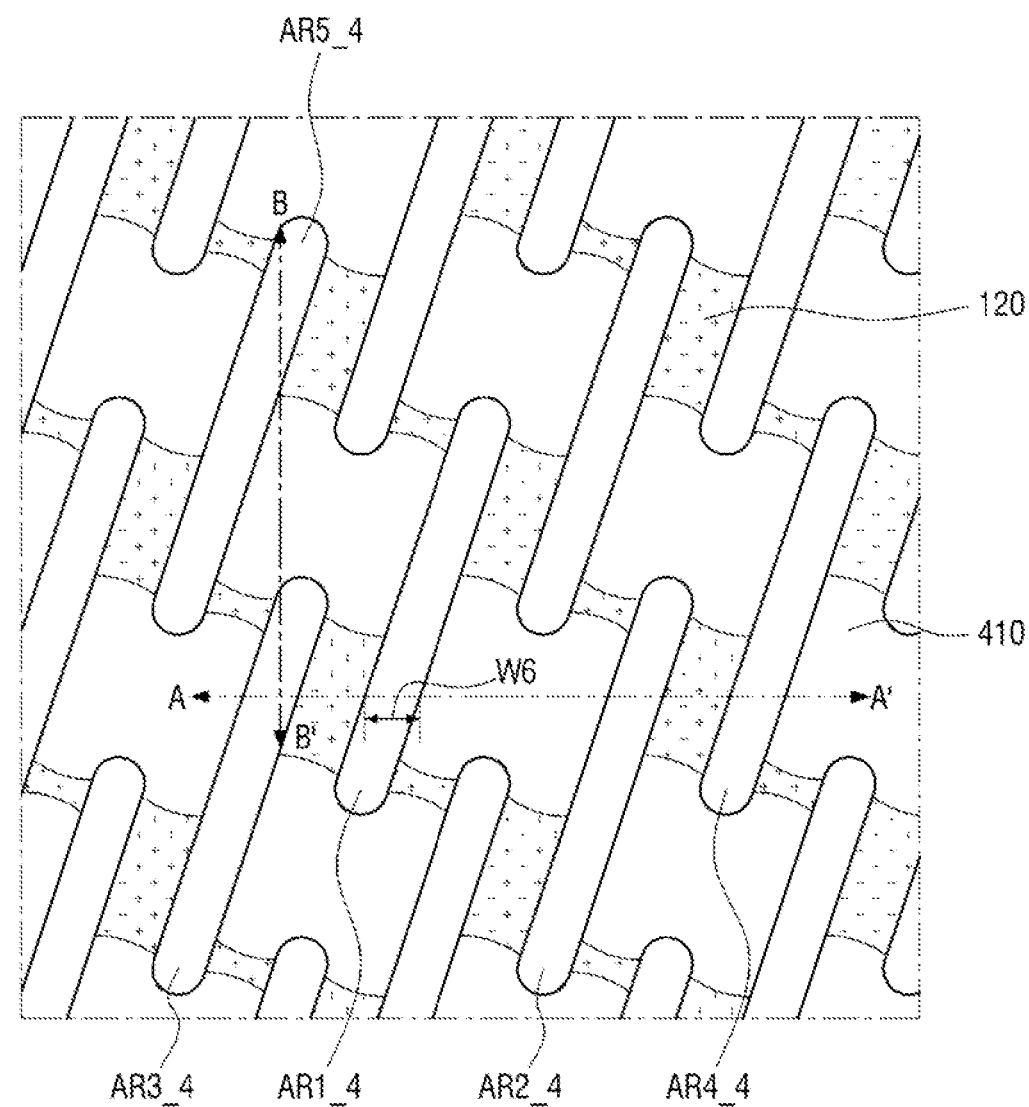
Figure 9:
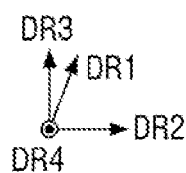

FIG. 9 is a layout diagram at a third level that illustrates a semiconductor device according to other embodiments of the present disclosure. FIGS. 10 and 11 are cross-sectional views taken along the line A-A' and the line B-B' of FIG. 9, respectively.

Referring to FIGS. 2, 9 to 11, in a semiconductor device according to other embodiments of the present disclosure, each of a plurality of active regions includes a fourth part disposed at a third level LV3 that is located below the first level LV1. The third level LV3 is indicated by a dot-dashed line in the figures. In addition, the first element isolation regions 410 include protrusions 410a and 410b that extend into the respective active regions at the first level LV1.

For example, according to other embodiments, the first active region AR1 includes a fourth part AR1_4 located at the third level LV3. The second active region AR2 includes a fourth part AR2_4 located at the third level LV3. The third active region AR3 includes a fourth part AR3_4 located at the third level LV3. The fourth active region AR4 includes a fourth part AR4_4 located at the third level LV3. The fifth active region AR5 includes a fourth part AR5_4 located at a third level LV3.

According to other embodiments, the fourth part AR1_4 of the first active region AR1 contacts each of the first and second parts AR1_1 and AR1_2 of the first active region AR1. The fourth part AR2_4 of the second active region AR2 contacts each of the first and second parts AR2_1 and AR2_2 of the second active region AR2. The fourth part AR3_4 of the third active region AR3 contacts each of the first and second parts AR3_1 and AR3_2 of the third active region AR3. The fourth part AR4_4 of the fourth active region AR4 contacts each of the first and second parts AR4_1 and AR4_2 of the fourth active region AR4. The fourth part AR5_4 of the fifth active region AR5 contacts each of the first and second parts AR5_1 and AR5_2 of the fifth active region AR5.

For example, according to other embodiments, the first width W1 in the second direction DR2 of the first part AR1_1 of the first active region AR1 at the first level LV1 is less than a sixth width W6 in the second direction DR2 of the fourth part AR1_4 of the first active region AR1 at the third level LV3. That is, the width in the second direction DR2 of the first element isolation region 410 at the first level LV1 is greater than the width in the second direction DR2 of the first element isolation region 410 at the third level LV3. In addition, the width in the third direction DR3 of the first element isolation region 410 at the first level LV1 is greater than the width the third direction DR3 of the first element isolation region 410 at the third level LV3.

According to other embodiments, each of the second to fifth active regions AR2 to AR5 has a structure similar to the first active region AR1.

Hereinafter, a semiconductor device according to other embodiments of the present disclosure will be described with reference to FIGS. 12 and 13. The description will focus on differences from semiconductor devices shown in FIGS. 2 to 5.

Figure 12:
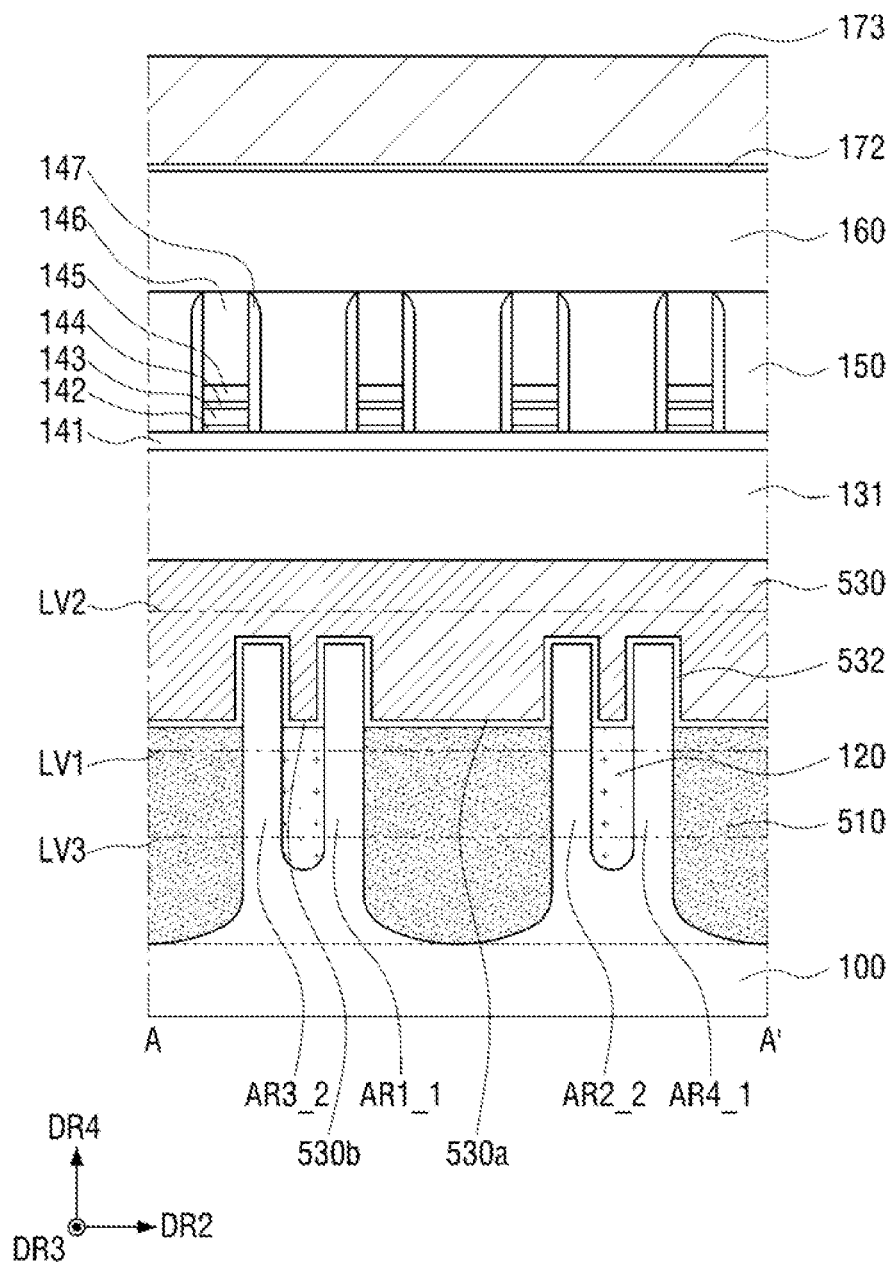
FIGS. 12 and 13 are cross-sectional views that illustrate a semiconductor device according to some other embodiments of the present disclosure.
Figure 13:
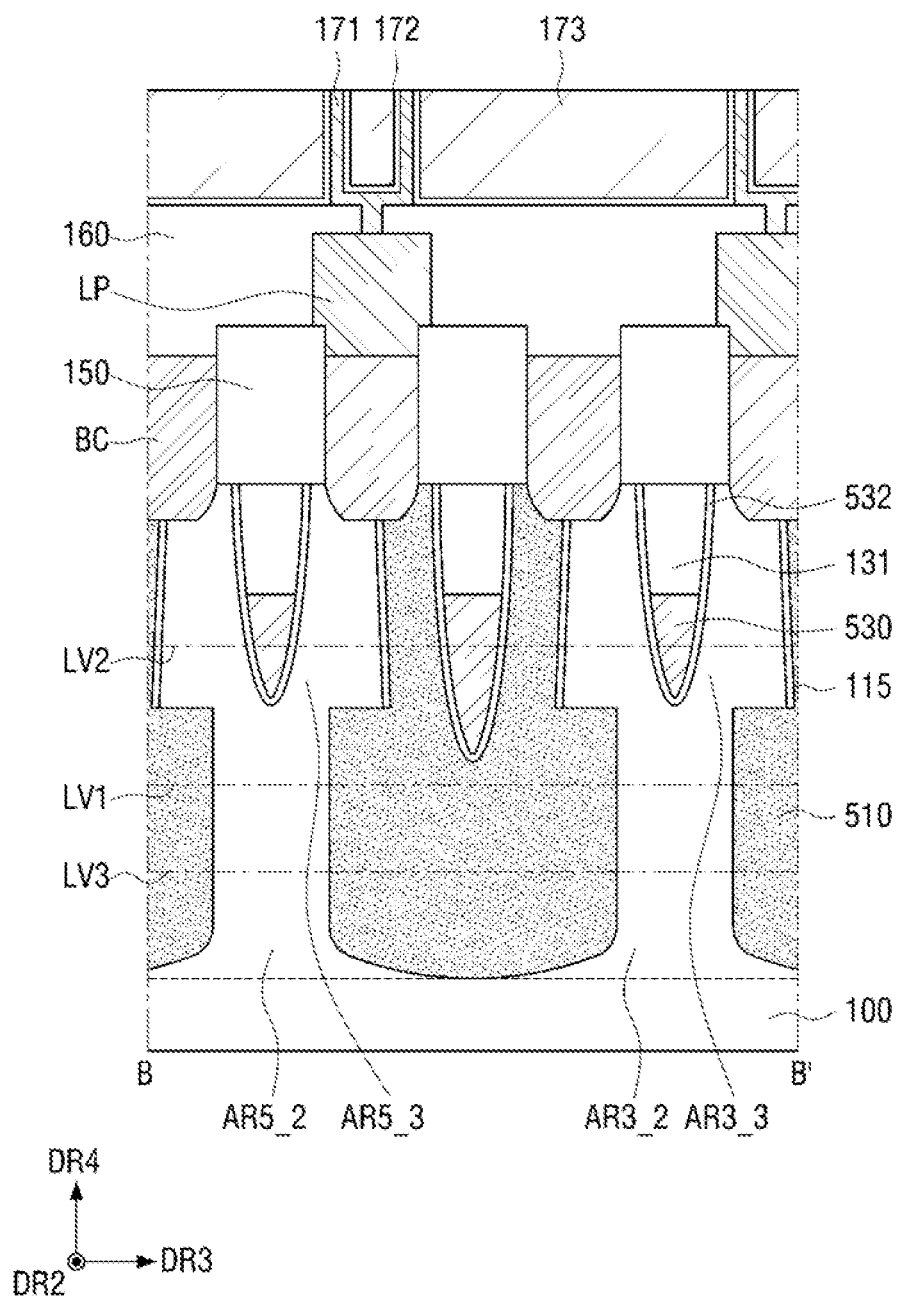

FIGS. 12 and 13 are cross-sectional views that illustrate a semiconductor device according to other embodiments of the present disclosure.

Referring to FIGS. 12 and 13, in a semiconductor device according to other embodiments of the present disclosure, side walls of each of the plurality of active regions that are surrounded by the gate electrode 530 in the cross-section of FIG. 12 extend in the fourth direction DR4 and are aligned with side walls of the active regions that are surrounded by the first element isolation region 510.

For example, according to other embodiments, side walls of the first part AR1_1 of the first active region AR1 that are surrounded by the gate electrode 530 extend in the fourth direction DR4 to be aligned with side walls surrounded by the first element isolation region 510. Side walls of the second part AR2_2 of the second active region AR2 that are surrounded by the gate electrode 530 extend in the fourth direction DR4 to be aligned with side walls surrounded by the first element isolation region 510. Side walls of the second part AR3_2 of the third active region AR3 that are surrounded by the gate electrode 530 extend in the fourth direction DR4 to be aligned with side walls surrounded by the first element isolation region 510. Side walls of the first part AR4_1 of the fourth active region AR4 that are surrounded by the gate electrode 530 extend in the fourth direction DR4 to be aligned with side walls surrounded by the first element isolation region 510.

According to other embodiments, a lower surface 530a of the gate electrode 530 disposed on the first element isolation region 510 is formed on the same plane as a lower surface 530b of the gate electrode 530 disposed on the second element isolation region 120. The gate insulating film 532 is disposed along the side walls and the bottom surface of the gate electrode 530.

Hereinafter, a semiconductor device according to other embodiments of the present disclosure will be described with reference to FIGS. 14 and 15. The description will focus on differences from semiconductor devices shown in FIGS. 2 to 5, 12, and 13.

Figure 14:
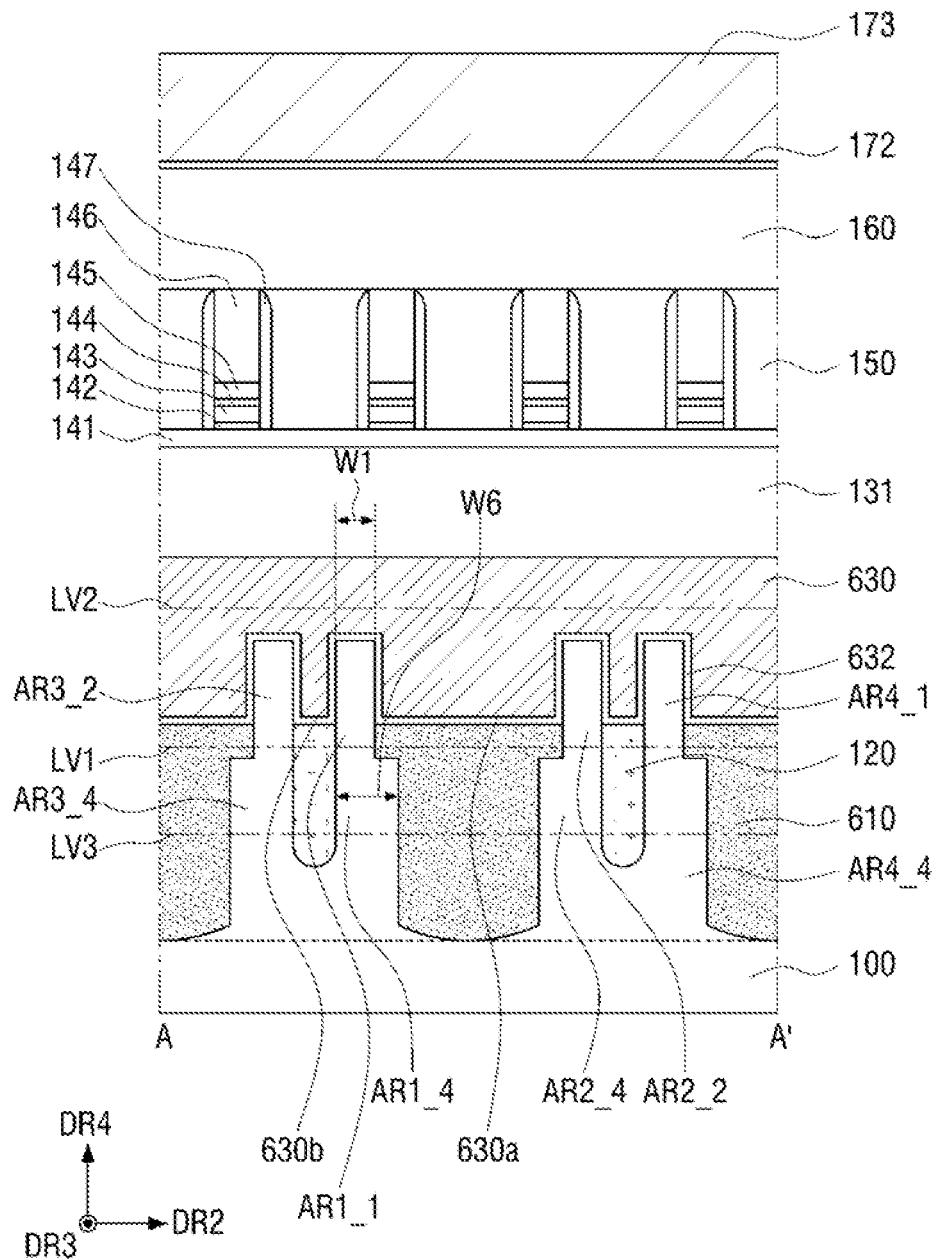
FIGS. 14 and 15 are cross-sectional views that illustrate a semiconductor device according to some other embodiments of the present disclosure.
Figure 15:
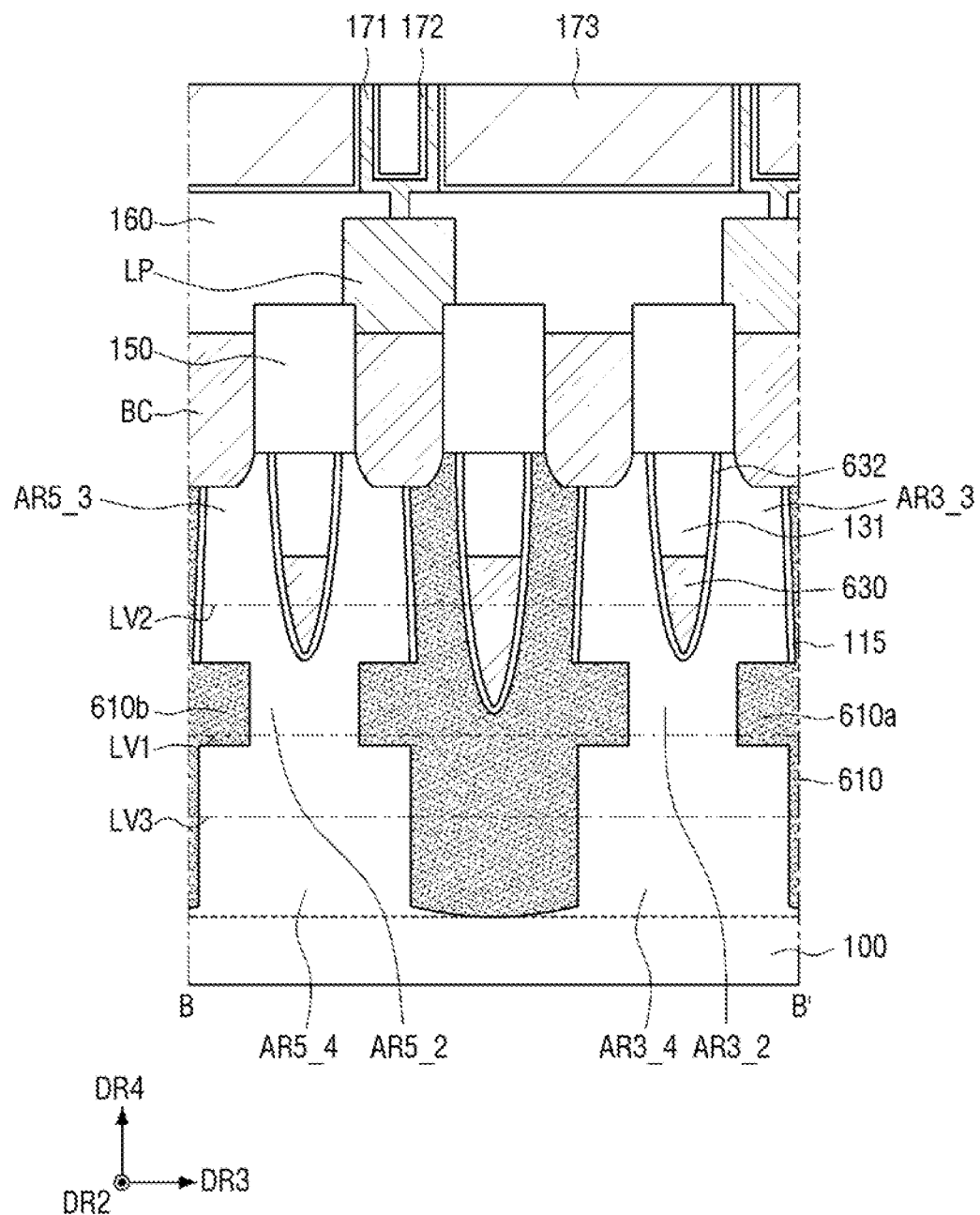

FIGS. 14 and 15 are cross-sectional views that illustrate a semiconductor device according to other embodiments of the present disclosure.

Referring to FIGS. 14 and 15, in a semiconductor device according to other embodiments of the present disclosure, side walls of each of the plurality of active regions surrounded by the gate electrode 530 in a cross-section of FIG. 14 extend in the fourth direction DR4.

For example, according to other embodiments, the side walls of the first part AR1_1 of the first active region AR1 that are surrounded by the gate electrode 630 extend in the fourth direction DR4.

According to other embodiments, a lower surface 630a of the gate electrode 630 disposed on the first element isolation region 610 is formed on the same plane as a lower surface 630b of the gate electrode 530 disposed on the second element isolation region 120. The gate insulating film 632 is disposed along the side walls and the bottom surface of the gate electrode 630.

In a semiconductor device according to other embodiments of the present disclosure, each of the plurality of active regions includes a fourth part disposed at the third level LV3 below the first level LV1.

For example, according to other embodiments, the first active region AR1 includes a fourth part AR1_4 located at the third level LV3. The first width W1 in the second direction DR2 of the first part AR1_1 of the first active region AR1 at the first level LV1 is less than the sixth width W6 in the second direction DR2 of the fourth part AR1_4 of the first active region AR1 at the third level LV3.

According to other embodiments, each of the second to fifth active regions AR2 to AR5 has a structure similar to that of the first active region AR1.

Hereinafter, a semiconductor device according to other embodiments of the present disclosure will be described with reference to FIG. 16. The description will focus on differences from semiconductor devices shown in FIGS. 2 to 5, 12, and 13.

Figure 16:
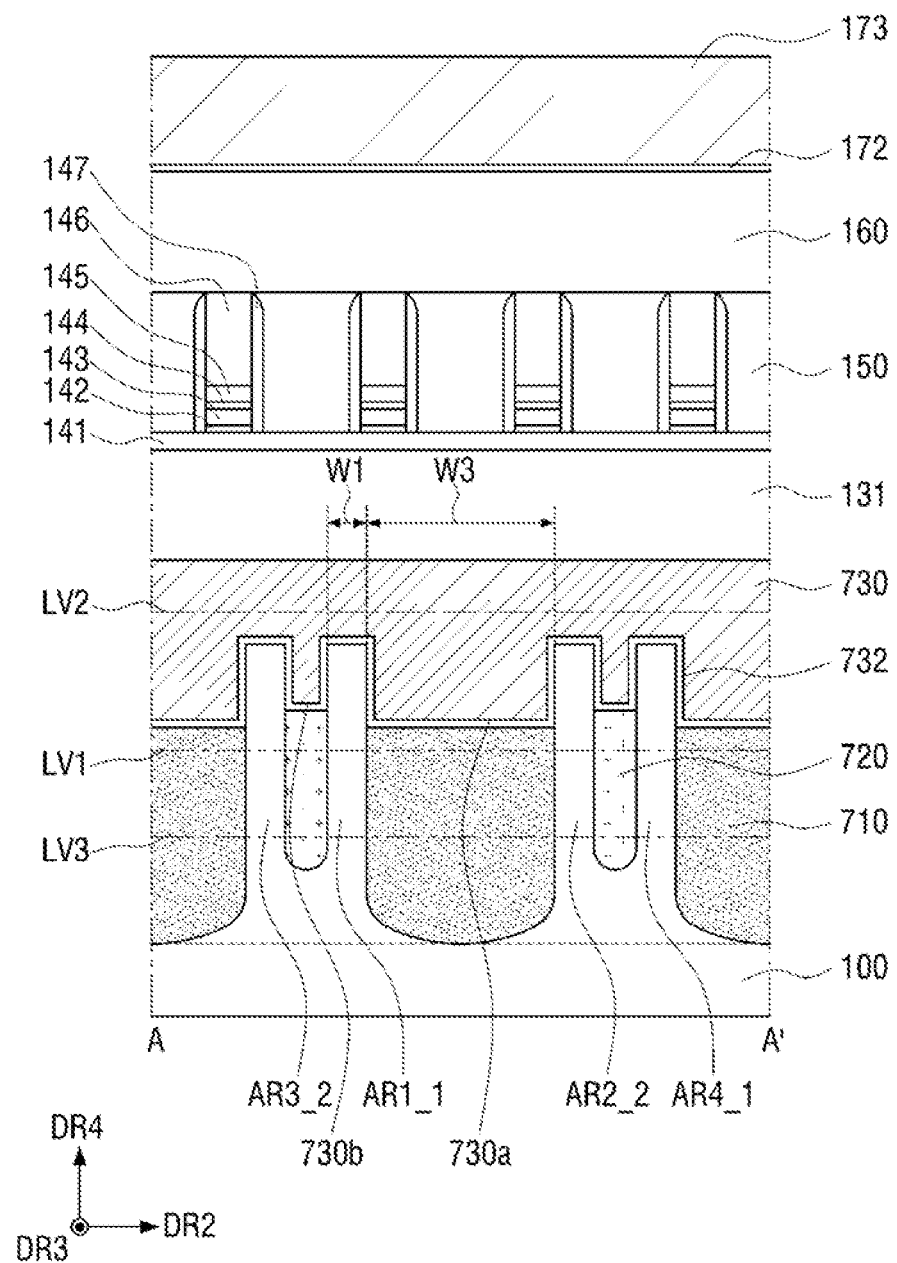
FIG. 16 is a cross-sectional view that illustrates a semiconductor device according to some other embodiments of the present disclosure.

FIG. 16 is a cross-sectional view that illustrates a semiconductor device according to other embodiments of the present disclosure.

Referring to FIG. 16, in a semiconductor device according to other embodiments of the present disclosure, the side walls of each of the plurality of active regions that are surrounded by the gate electrode 730 of the present disclosure extend in the fourth direction DR4 and are aligned with side walls of the active regions that are surrounded by the first element isolation region 710.

According to other embodiments, a lower surface 730a of the gate electrode 730 disposed on the first element isolation region 710 is lower than a lower surface 730b of the gate electrode 730 disposed on the second element isolation region 720. The gate insulating film 732 is disposed along the side walls and the bottom surface of the gate electrode 730.

Hereinafter, a semiconductor device according to other embodiments of the present disclosure will be described with reference to FIG. 17. The description will focus on differences from semiconductor devices shown in FIGS. 2 to 5, 12, and 13.

Figure 17:
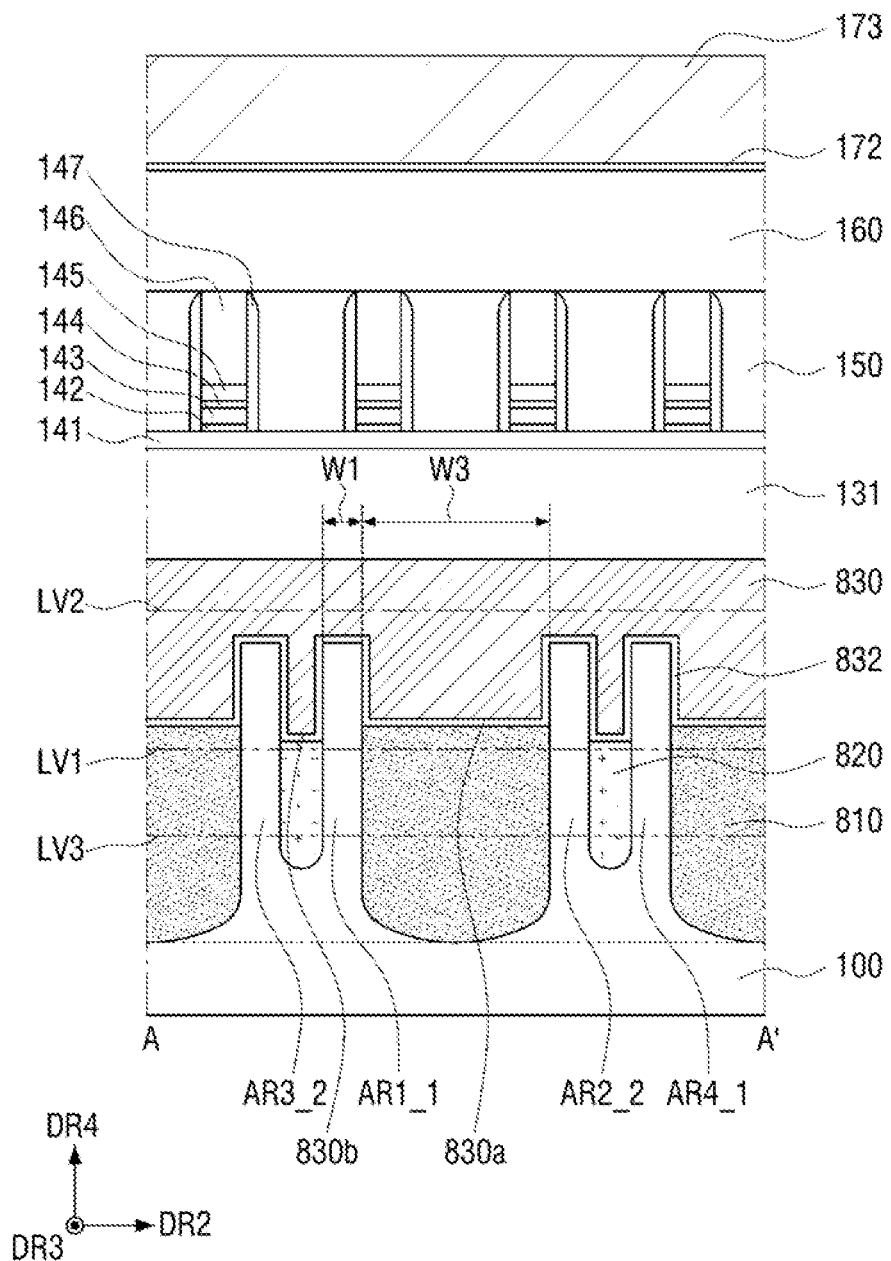
FIG. 17 is a cross-sectional view that illustrates a semiconductor device according to some other embodiments of the present disclosure.

FIG. 17 is a cross-sectional view that illustrates a semiconductor device according to other embodiments of the present disclosure.

Referring to FIG. 17, in a semiconductor device according to other embodiments of the present disclosure, the side walls of each of the plurality of active regions that are surrounded by a gate electrode 830 extend in the fourth direction DR4 and are aligned with side walls of the active regions that are surrounded by the first element isolation region 810.

According to other embodiments, a lower surface 830a of the gate electrode 830 disposed on the first element isolation region 810 is higher than a lower surface 830b of the gate electrode 830 disposed on the second element isolation region 820. The gate insulating film 832 is disposed along the side walls and the bottom surface of the gate electrode 830.

Hereinafter, a semiconductor device according to other embodiments of the present disclosure will be described with reference to FIG. 18. The description will focus on differences from semiconductor devices shown in FIGS. 2 to 5, 12, and 13.

Figure 18:
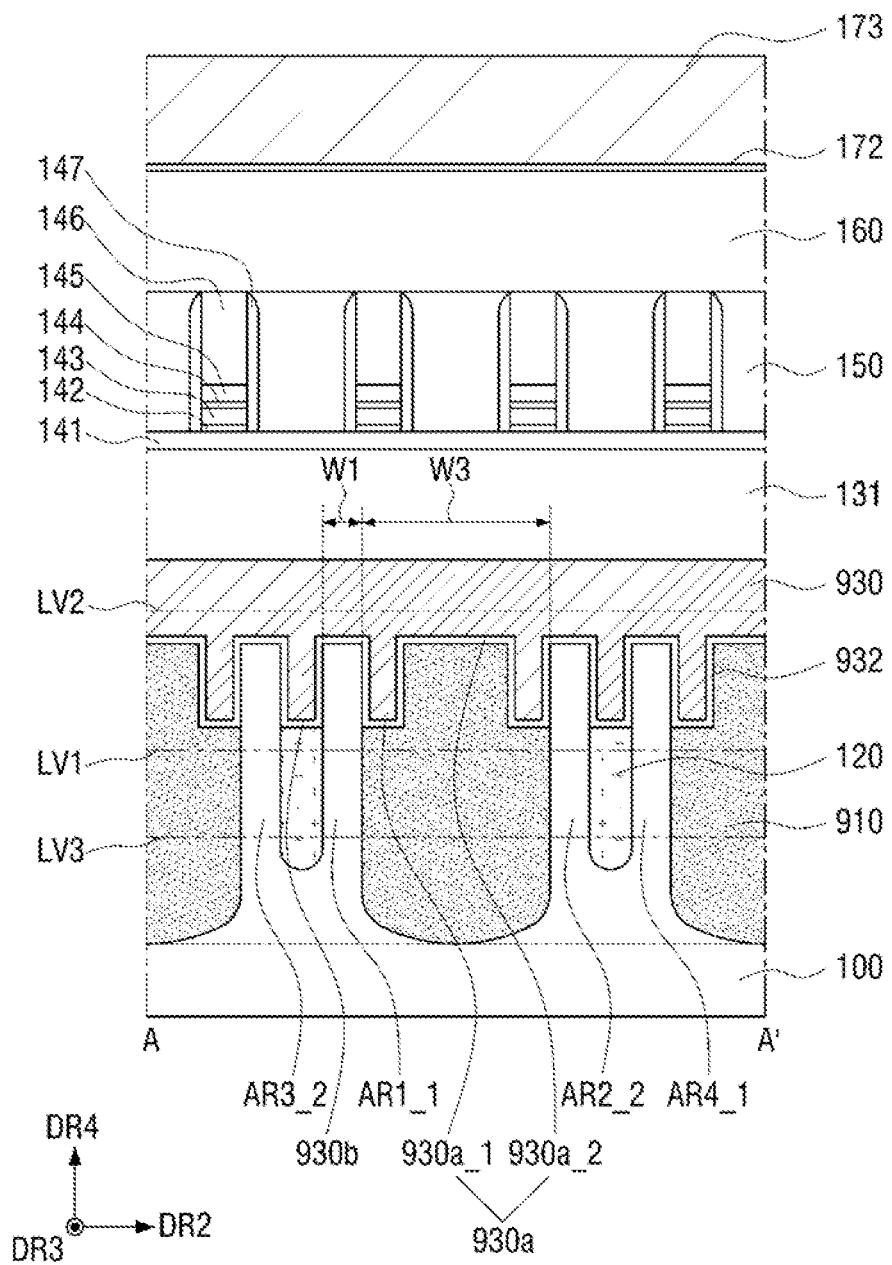
FIG. 18 is a cross-sectional view that illustrates a semiconductor device according to some other embodiments of the present disclosure.

FIG. 18 is a cross-sectional view that illustrates a semiconductor device according to other embodiments of the present disclosure.

Referring to FIG. 18, in a semiconductor device according to other embodiments of the present disclosure, side walls of each of the plurality of active regions that are surrounded by a gate electrode 930 extend in the fourth direction DR4 and are aligned with side walls of the active regions that are surrounded by the first element isolation region 910.

According to other embodiments, a lower surface 930a of the gate electrode 930 disposed on the first element isolation region 910 includes a first lower surface 930a_1 and a second lower surface 930a_2. The second lower surface 930a_2 of the gate electrode 930 extends between the first lower surfaces 930a_1 of the gate electrode 930. The first lower surface 930a_1 of the gate electrode 930 are lower than the second lower surface 930a2 of the gate electrode 930.

According to other embodiments, the first lower surface 930a_1 of the gate electrode 930 disposed on the first element isolation region 910 is formed on the same plane as the lower surface 930b of the gate electrode 930 disposed on the second element isolation region 120. The gate insulating film 932 is disposed along the side walls and the bottom surface of the gate electrode 930.

Hereinafter, a semiconductor device according to other embodiments of the present disclosure will be described with reference to FIG. 19. The description will focus on differences from semiconductor devices shown in FIGS. 2 to 5, 12, and 13.

Figure 19:
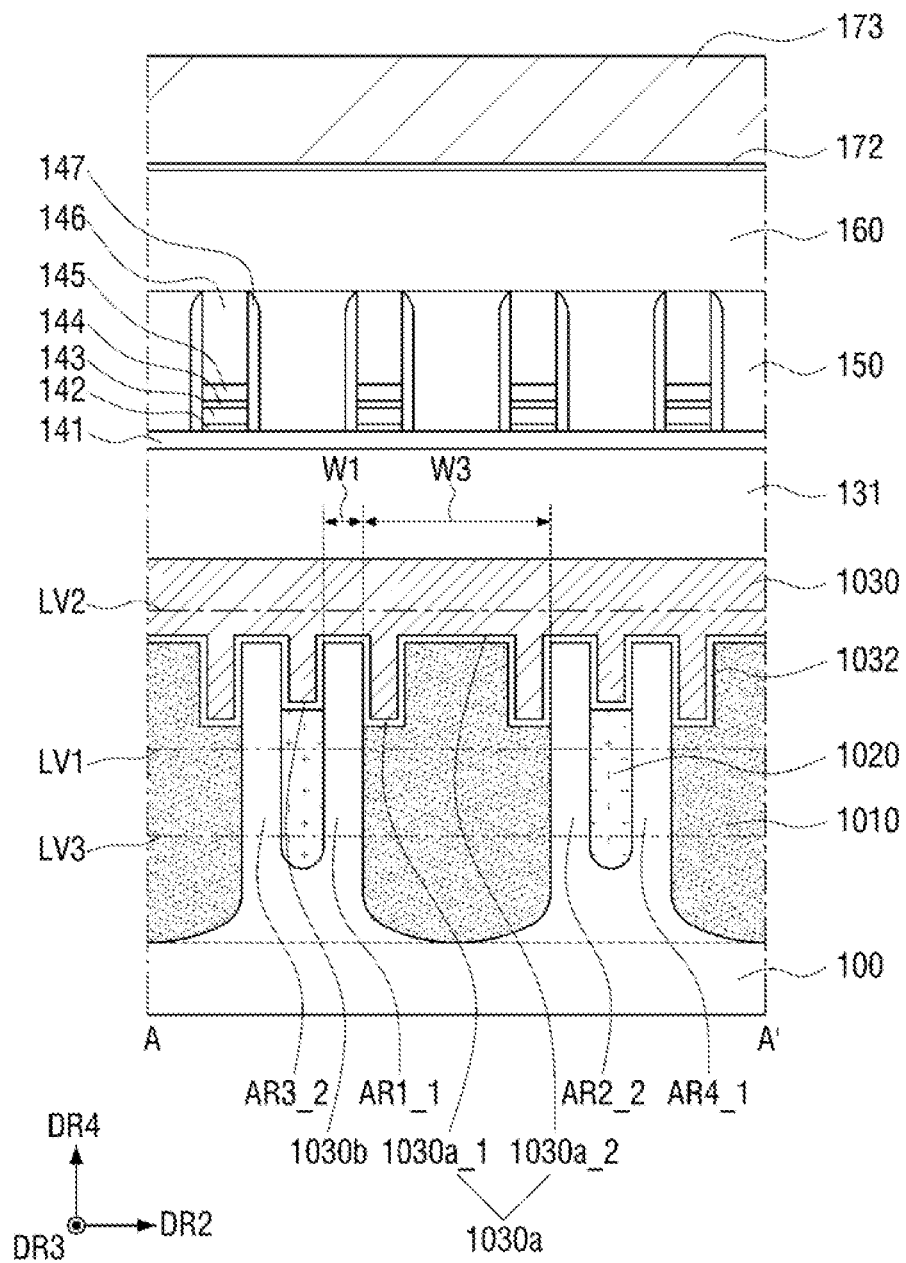
FIG. 19 is a cross-sectional view that illustrates a semiconductor device according to other embodiments of the present disclosure.

FIG. 19 is a cross-sectional view that illustrates a semiconductor device according to other embodiments of the present disclosure.

Referring to FIG. 19, in a semiconductor device according to other embodiments of the present disclosure, the side walls of each of the plurality of active regions that are surrounded by the gate electrode 1030 extend in the fourth direction DR4 and are aligned with side walls of the active regions that are surrounded by the first element isolation region 1010.

According to other embodiments, a lower surface 1030a of a gate electrode 1030 disposed on the first element isolation region 1010 includes a first lower surface 1030a_1 and a second lower surface 1030a_2. The second lower surface 1030a_2 of the gate electrode 1030 extends between the first lower surfaces 1030a_1 of the gate electrode 1030. The first lower surface 1030a_1 of the gate electrode 1030 is lower than the second lower surface 1030a_2 of the gate electrode 1030.

According to other embodiments, the first lower surface 1030a_1 of the gate electrode 1030 disposed on the first element isolation region 1010 is lower than the lower surface 1030b of the gate electrode 1030 disposed on the second element isolation region 1020. The lower surface 1030b of the gate electrode 1030 disposed on the second element isolation region 1020 extends between the first lower surface 1030a_1 of the gate electrode 1030 and the second lower surface 1030a_2 of the gate electrode 1030. The gate insulating film 1032 is disposed along the side walls and the bottom surface of the gate electrode 1030.

Hereinafter, a semiconductor device according to other embodiments of the present disclosure will be described with reference to FIG. 20. The description will focus on differences from semiconductor devices shown in FIGS. 2 to 5, 12, and 13.

Figure 20:
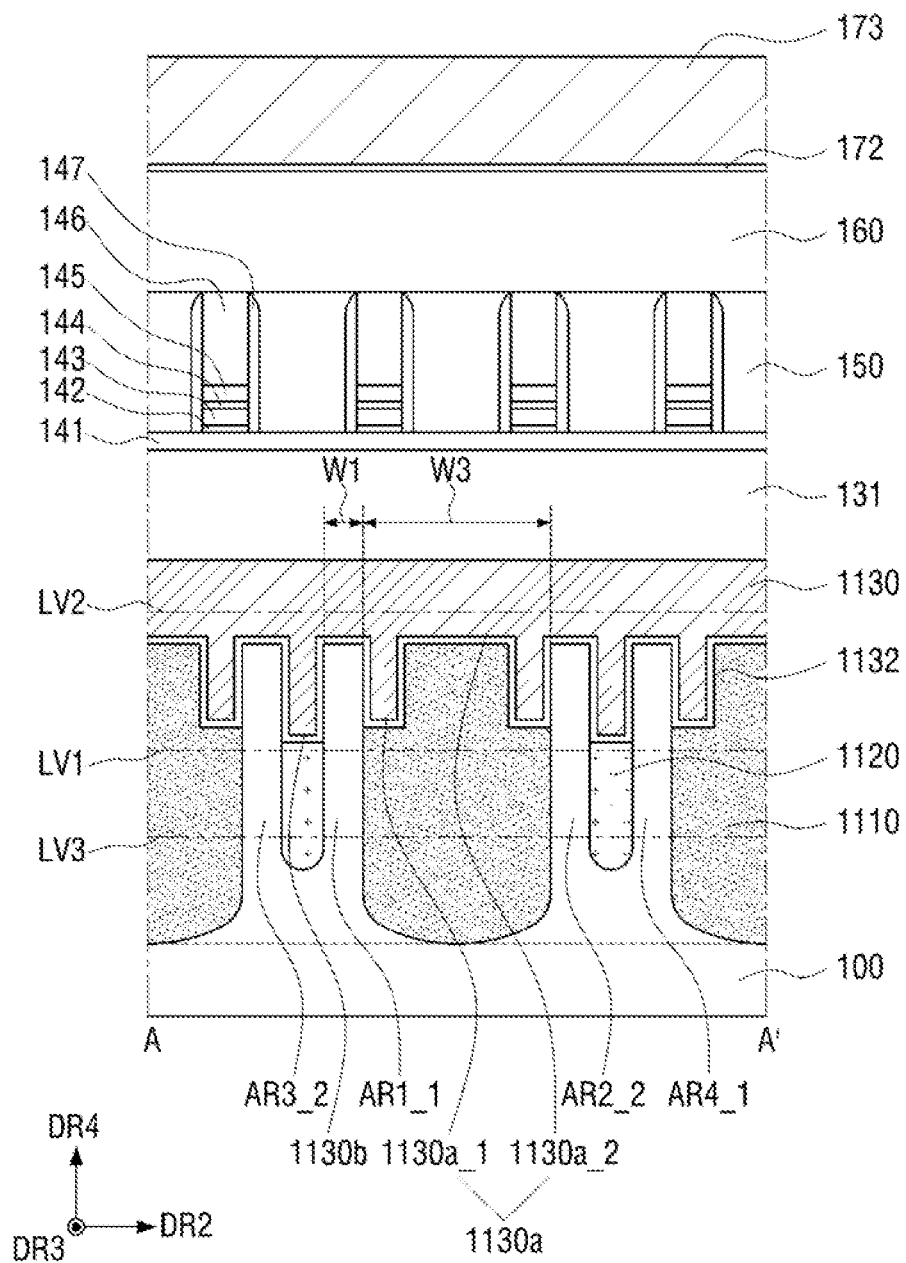
FIG. 20 is a cross-sectional view that illustrates a semiconductor device according to other embodiments of the present disclosure.

FIG. 20 is a cross-sectional view that illustrates a semiconductor device according to other embodiments of the present disclosure.

Referring to FIG. 20, in a semiconductor device according to other embodiments of the present disclosure, side walls of each of a plurality of active regions that are surrounded by a gate electrode 1130 may extend in the fourth direction DR4 and are aligned with side walls of the active regions that are surrounded by the first element isolation region 1110.

According to other embodiments, a lower surface 1130a of the gate electrode 1130 disposed on the first element isolation region 1110 includes a first lower surface 1130a_1 and a second lower surface 1130a_2. The second lower surface 1130a_2 of the gate electrode 1130 extends between the first lower surfaces 1130a_1 of the gate electrode 1130. The first lower surface 1130a_1 of the gate electrode 1130 are lower than the second lower surface 1130a_2 of the gate electrode 1130.

According to other embodiments, the first lower surface 1130a_1 of the gate electrode 1130 disposed on the first element isolation region 1110 is higher than the lower surface 1130b of the gate electrode 1130 disposed on the second element isolation region 1120. The gate insulating film 1132 is disposed along the side walls and the bottom surface of the gate electrode 1130.

Hereinafter, a method for fabricating a semiconductor device according to some embodiments of the present disclosure will be described with reference to FIGS. 2, 4 and 21 to 35.

FIGS. 21, 23, 25, 27, 30, and 32 are intermediate stage layout diagrams at the first level that illustrate a method for fabricating a semiconductor device according to some embodiments of the present disclosure. FIGS. 22, 24, 26, 28, 29, 31, and 33 to 35 are intermediate stage drawings that illustrate a method for fabricating a semiconductor device according to some embodiments of the present disclosure.

Figure 21:
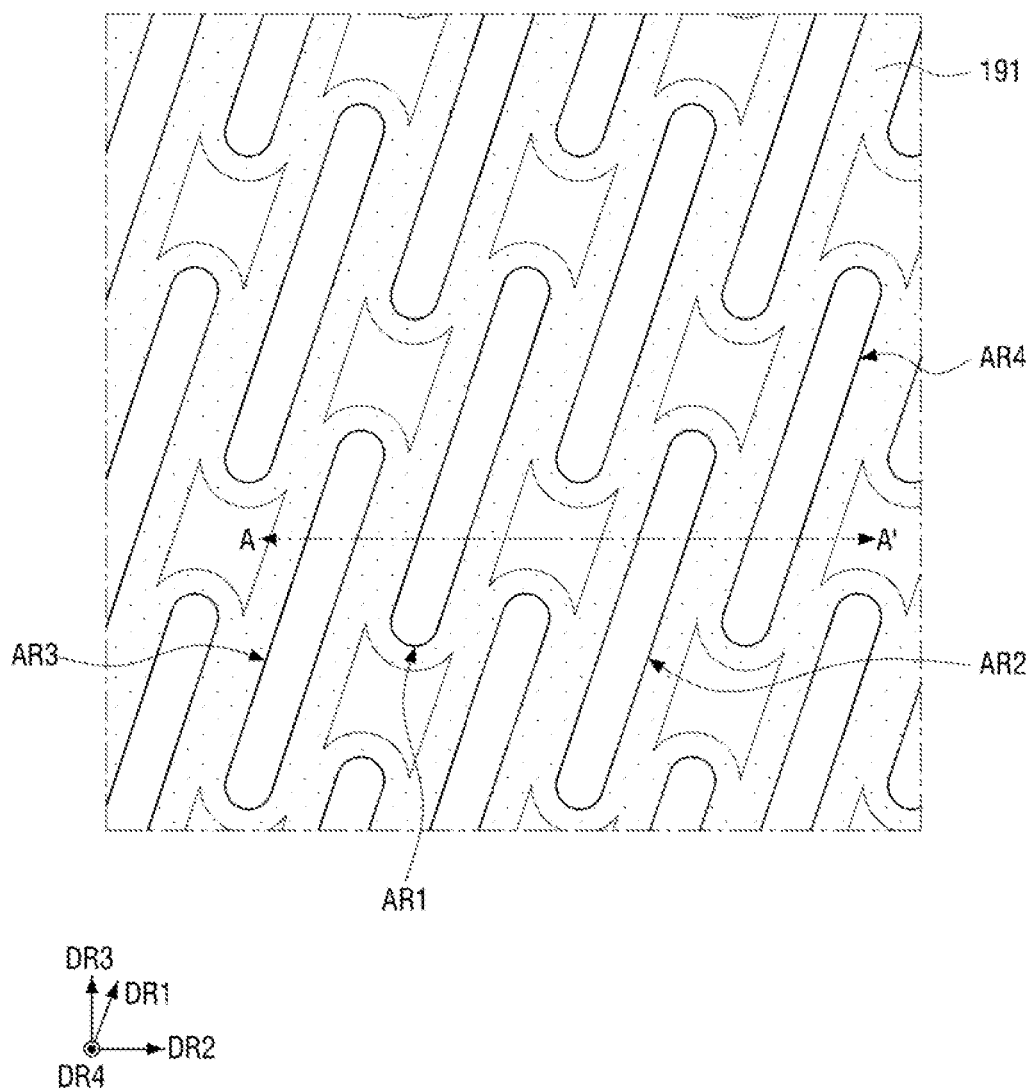
FIGS. 21, 23, 25, 27, 30, and 32 are intermediate stage layout diagrams at the first level that illustrate a method for fabricating a semiconductor device according to some embodiments of the present disclosure.
Figure 22:
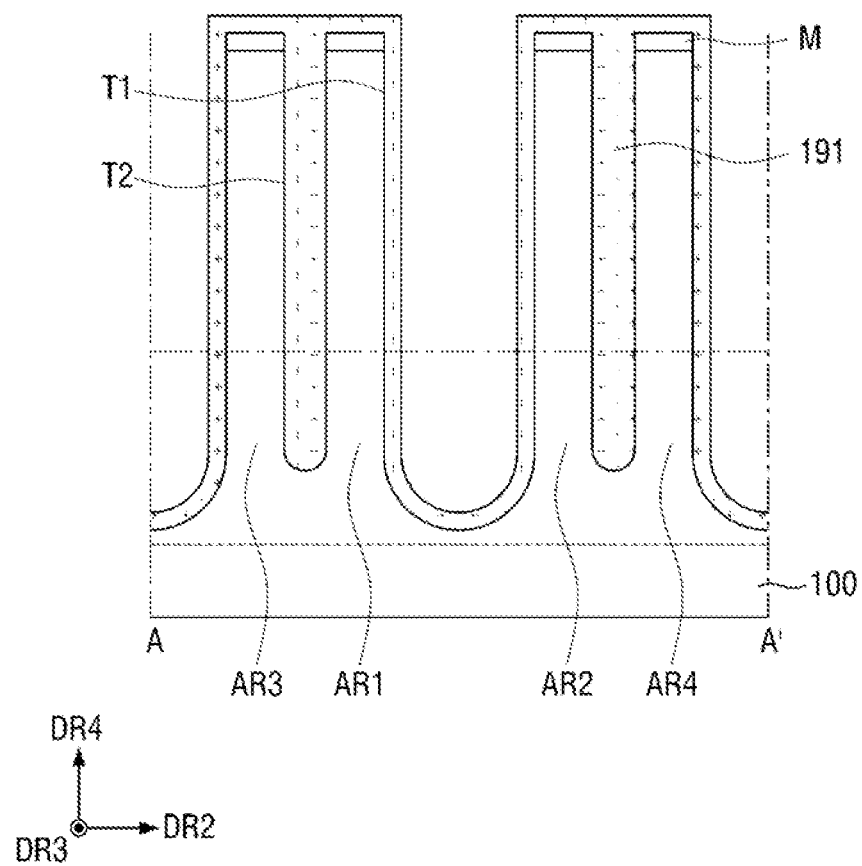
FIGS. 22, 24, 26, 28, 29, 31, and 33 to 35 illustrate intermediate stages of a method for fabricating a semiconductor device according to some embodiments of the present disclosure.

Referring to FIGS. 21 and 22, according to some embodiments, a first trench T1 and a second trench T2 are formed on the substrate 100, using a mask pattern M. First to fourth active regions AR1 to AR4 are defined on the substrate 100 by the first trench T1 and the second trench T2.

Subsequently, according to some embodiments, a first insulating film 191 is formed that conformally covers each of the first trench T1, the second trench T2, the first to fourth active regions AR1 to AR4, and the mask pattern M. In this case, the first insulating film 191 completely fills the second trench T2. The first insulating film 191 may include, for example, silicon oxide ($SiO_2$).

In some other embodiments, the mask pattern M is removed after forming the first trench T1 and the second trench T2. In this case, the first insulating film 191 is formed directly on the upper surfaces of each of the first to fourth active regions AR1 to AR4.

Figure 23:
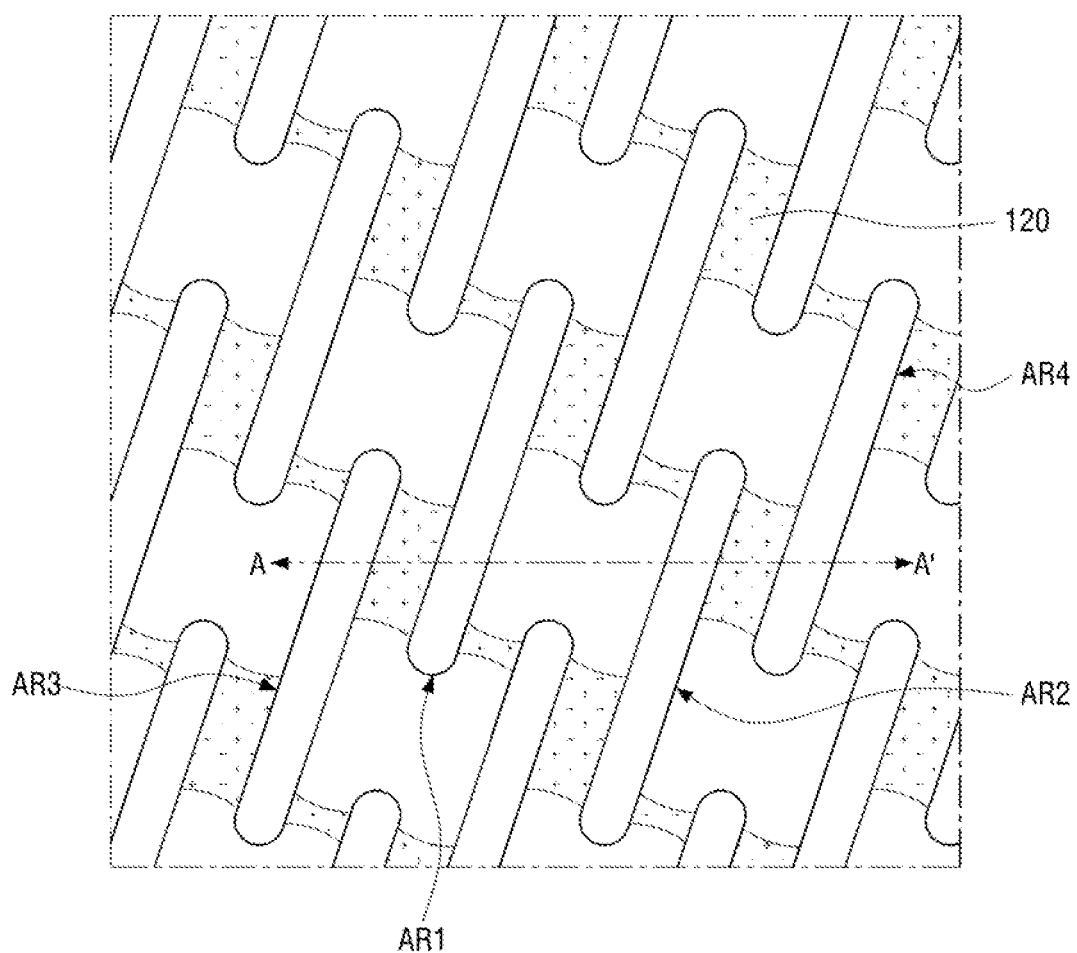
Figure 23:
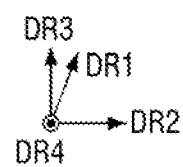
Figure 24:
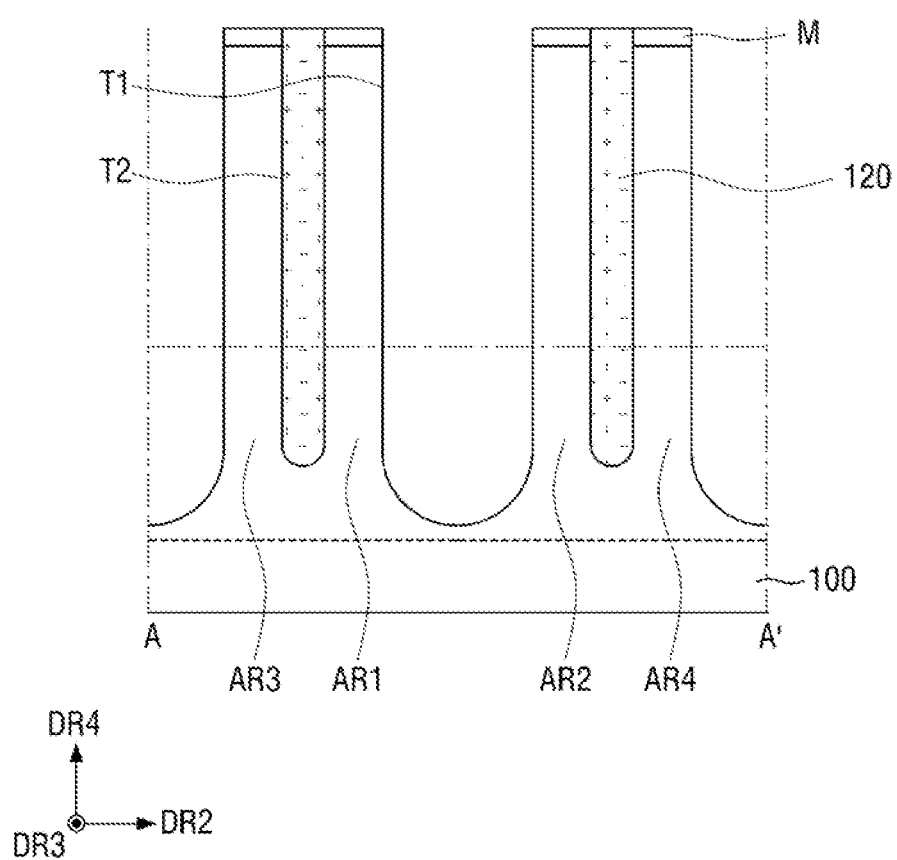

Referring to FIGS. 23 and 24, according to some embodiments, those portions of the first insulating film 191 that are formed along the upper surface and side walls of the mask pattern M and the side walls and bottom surfaces of the first trench T1 are removed. In this case, the portion of the first insulating film 191 formed inside the second trench T2 is not removed. Therefore, the second element isolation region 120 is formed inside the second trench T2.

Figure 25:
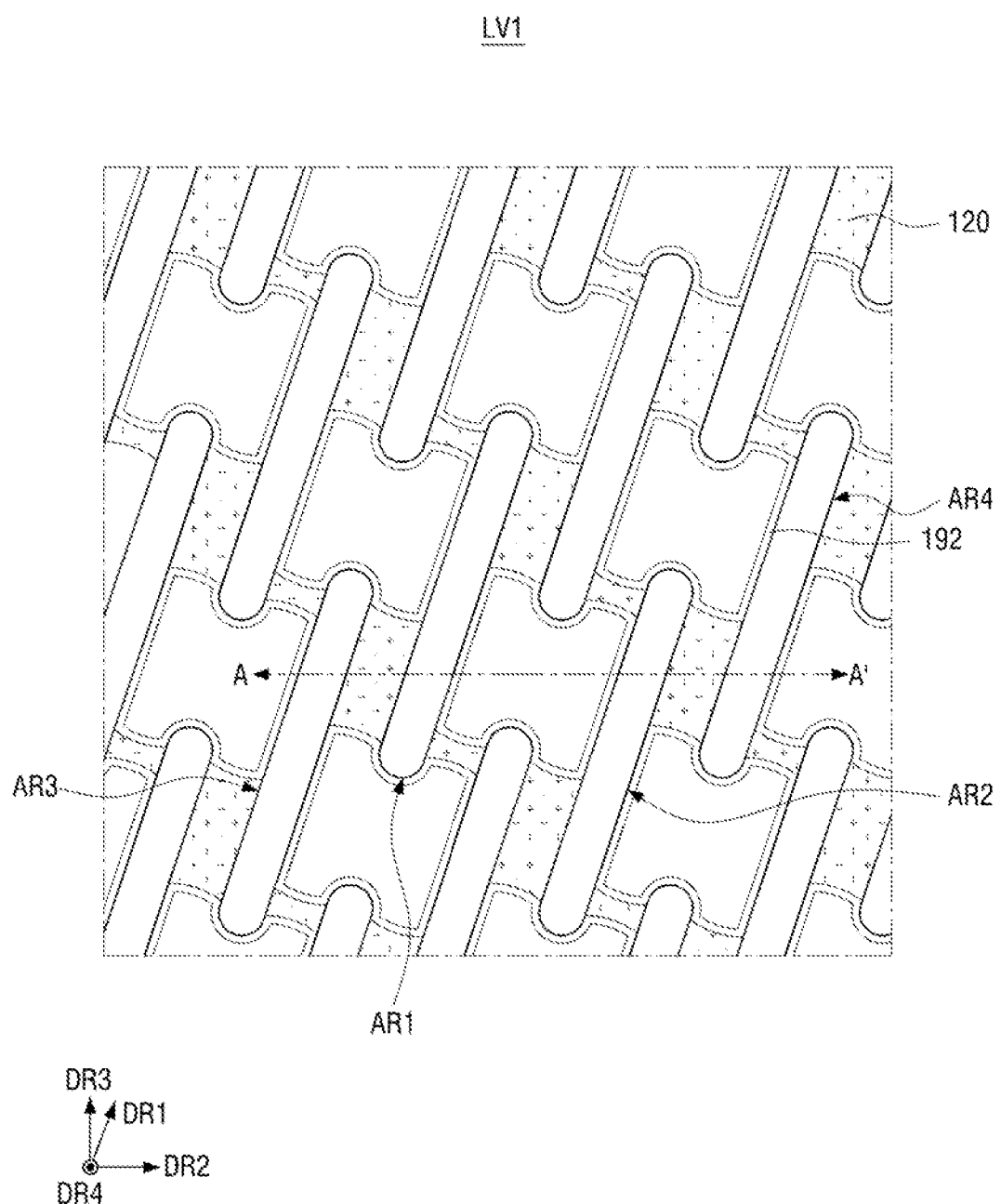
Figure 26:
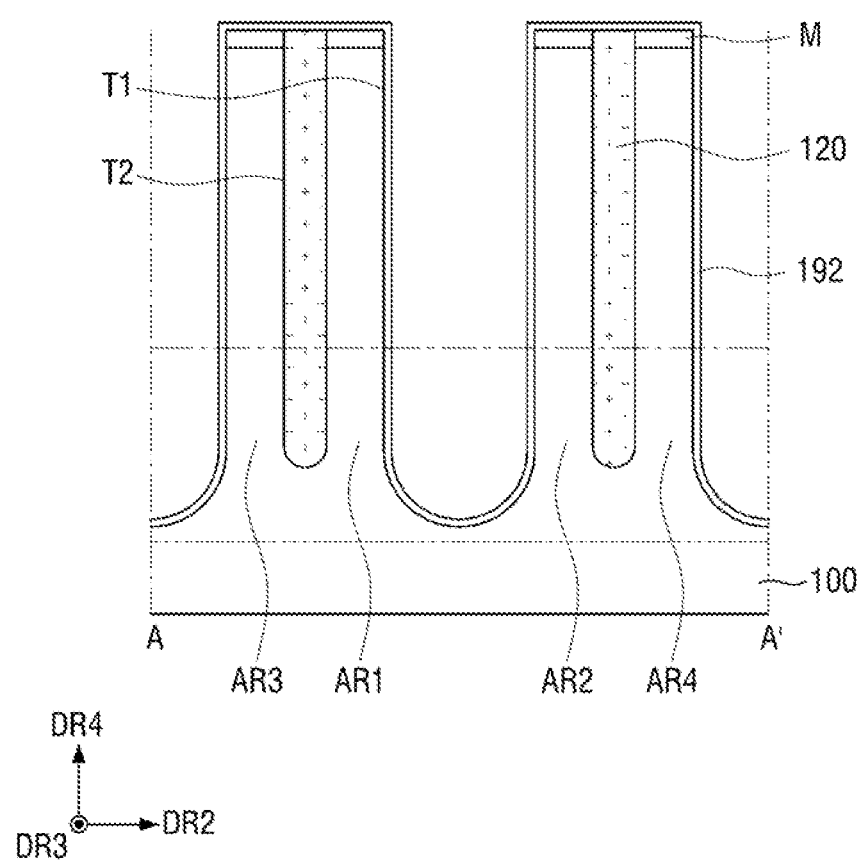

Referring to FIGS. 25 and 26, according to some embodiments, a second insulating film 192 is formed that conformally covers the upper surface of the second element isolation region 120, the mask pattern M, and the side walls and the bottom surface of the first trench T1. The second insulating film 192 may include, for example, silicon oxide ($SiO_2$).

Figure 27:
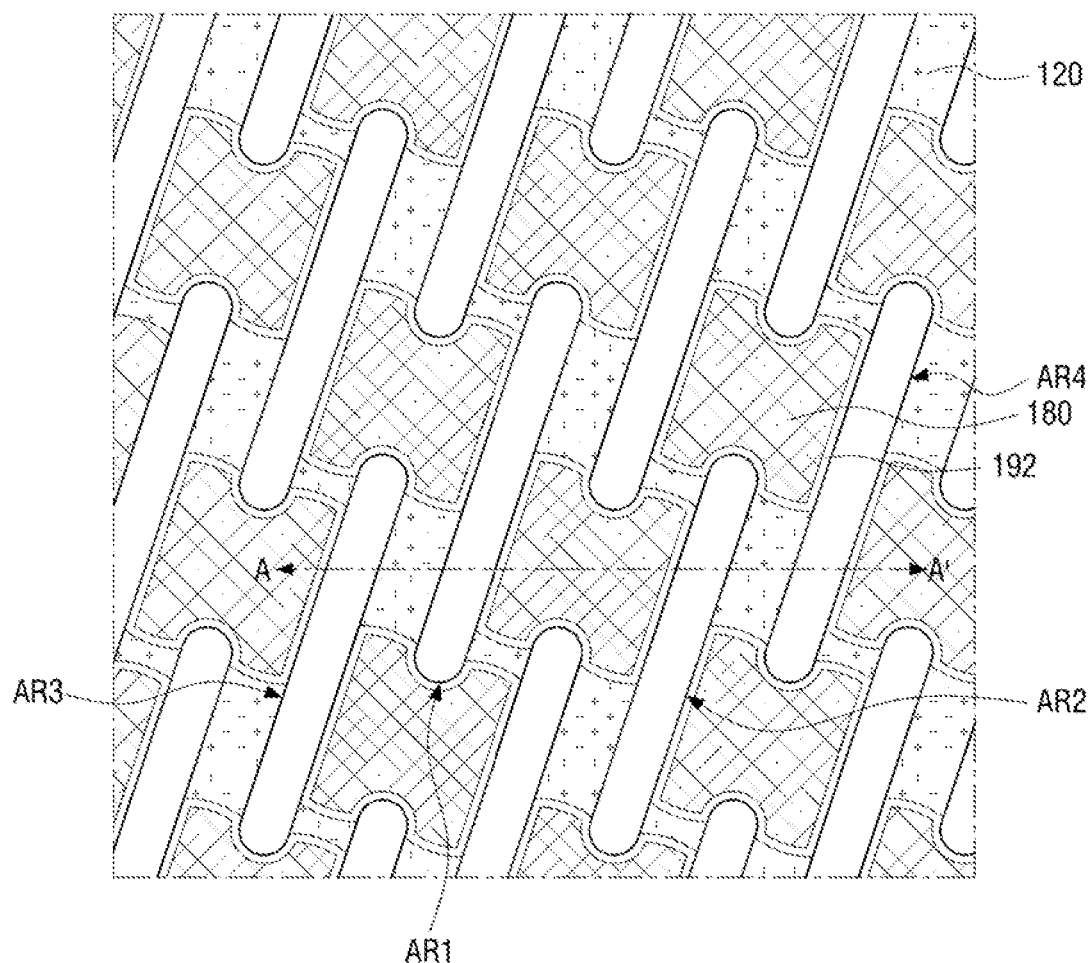
Figure 28:
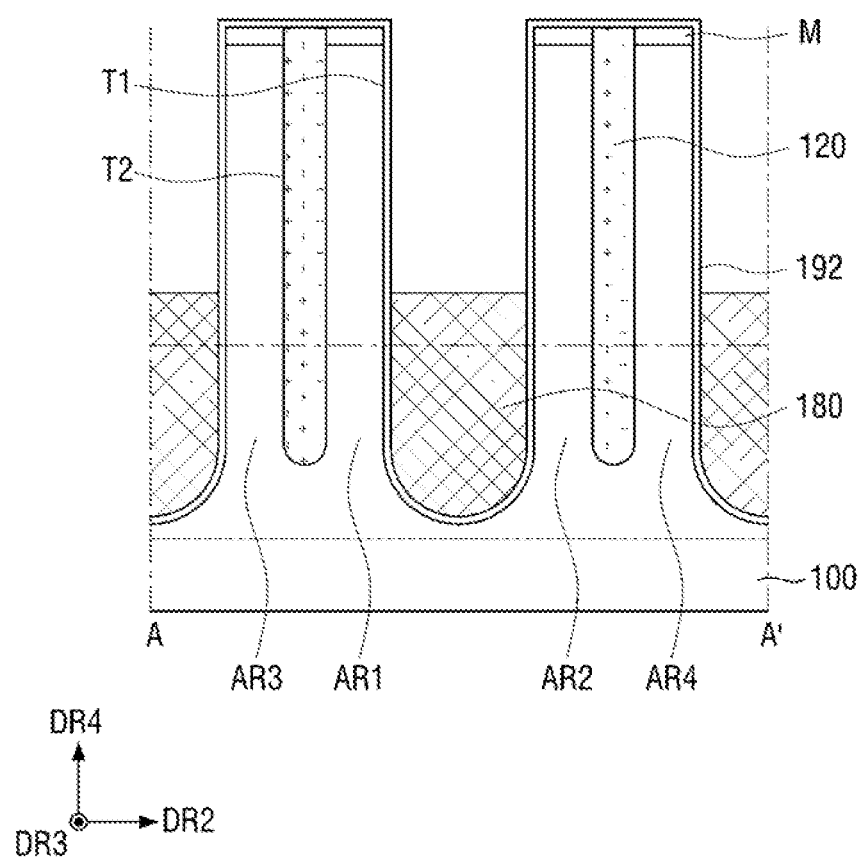

Referring to FIGS. 27 and 28, according to some embodiments, a sacrificial film 180 is formed on the second insulating film 192 that partially fills the first trench T1. The sacrificial film may include, for example, one of SOH or silicon nitride (SiN).

Figure 29:
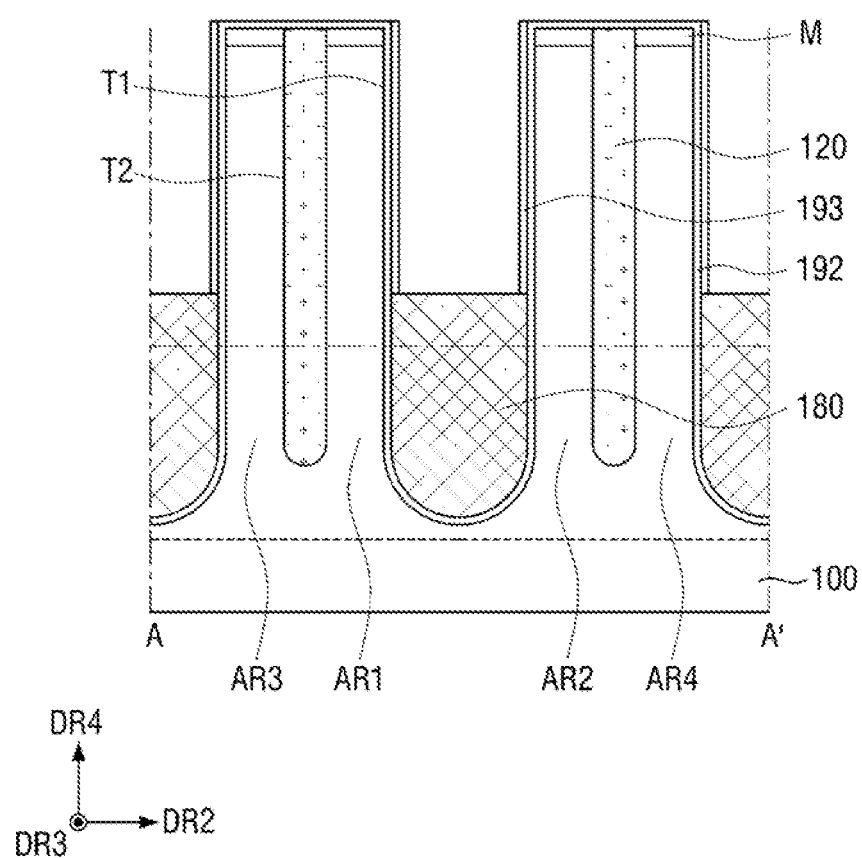

Referring to FIG. 29, according to some embodiments, a third insulating film 193 is formed on the sacrificial film 180 along the side walls of the second insulating film 192. The third insulating film 193 may include, for example, one of silicon oxide ($SiO_2$) or silicon nitride (SiN).

Figure 30:
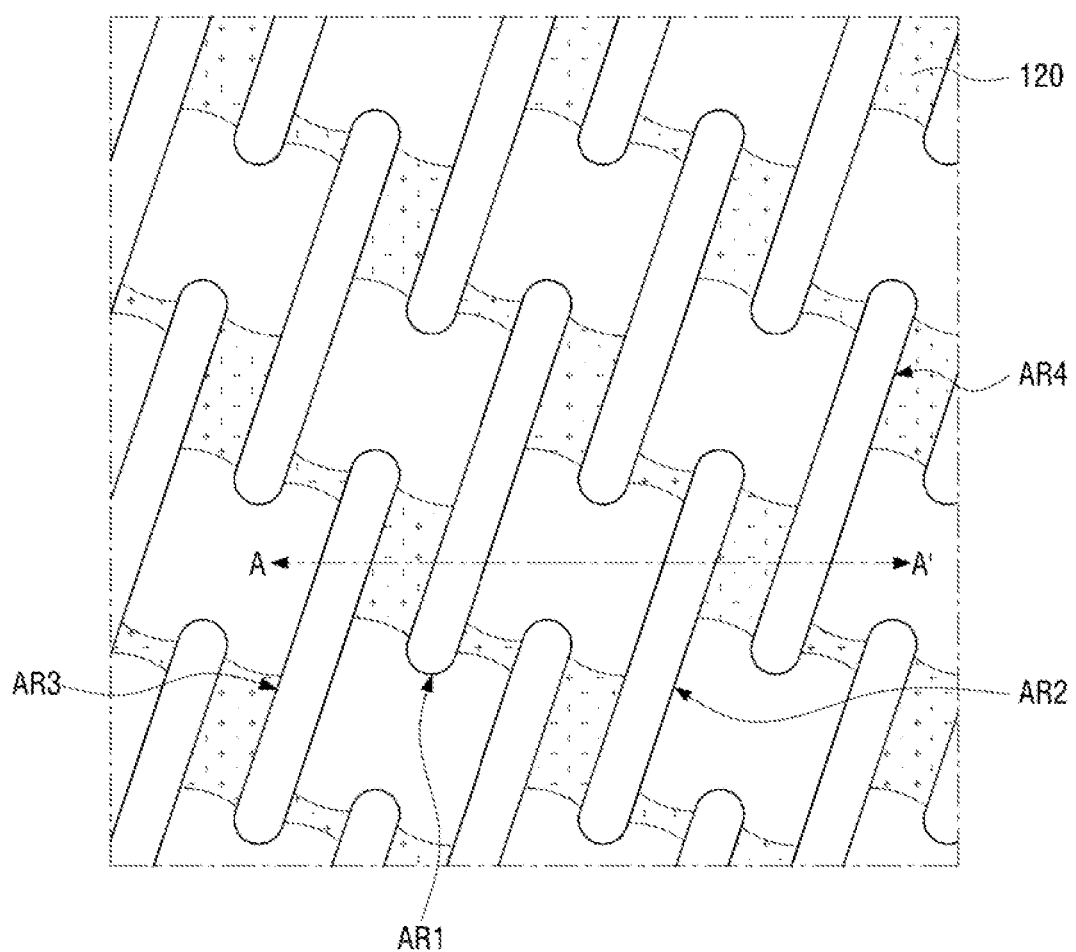
Figure 31:
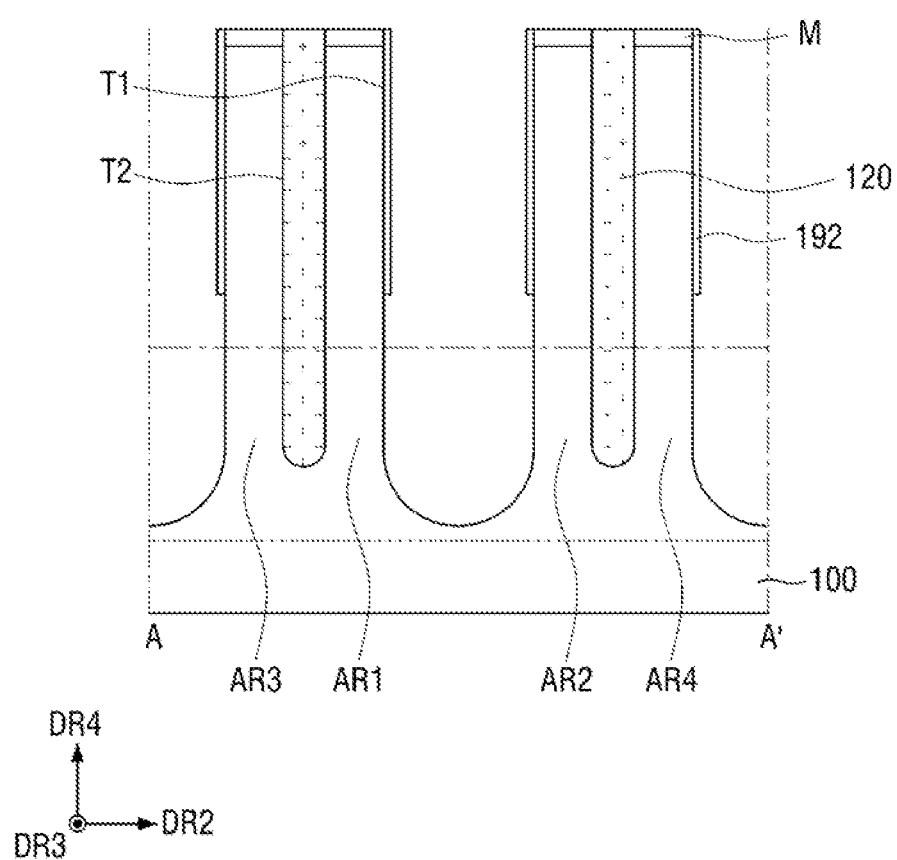

Referring to FIGS. 30 and 31, according to some embodiments, those portions of the third insulating film 193, the sacrificial film 180, and a part of the second insulating film 192 that are formed along the side walls and the bottom surface of the sacrificial film 180 are removed.

Figure 32:
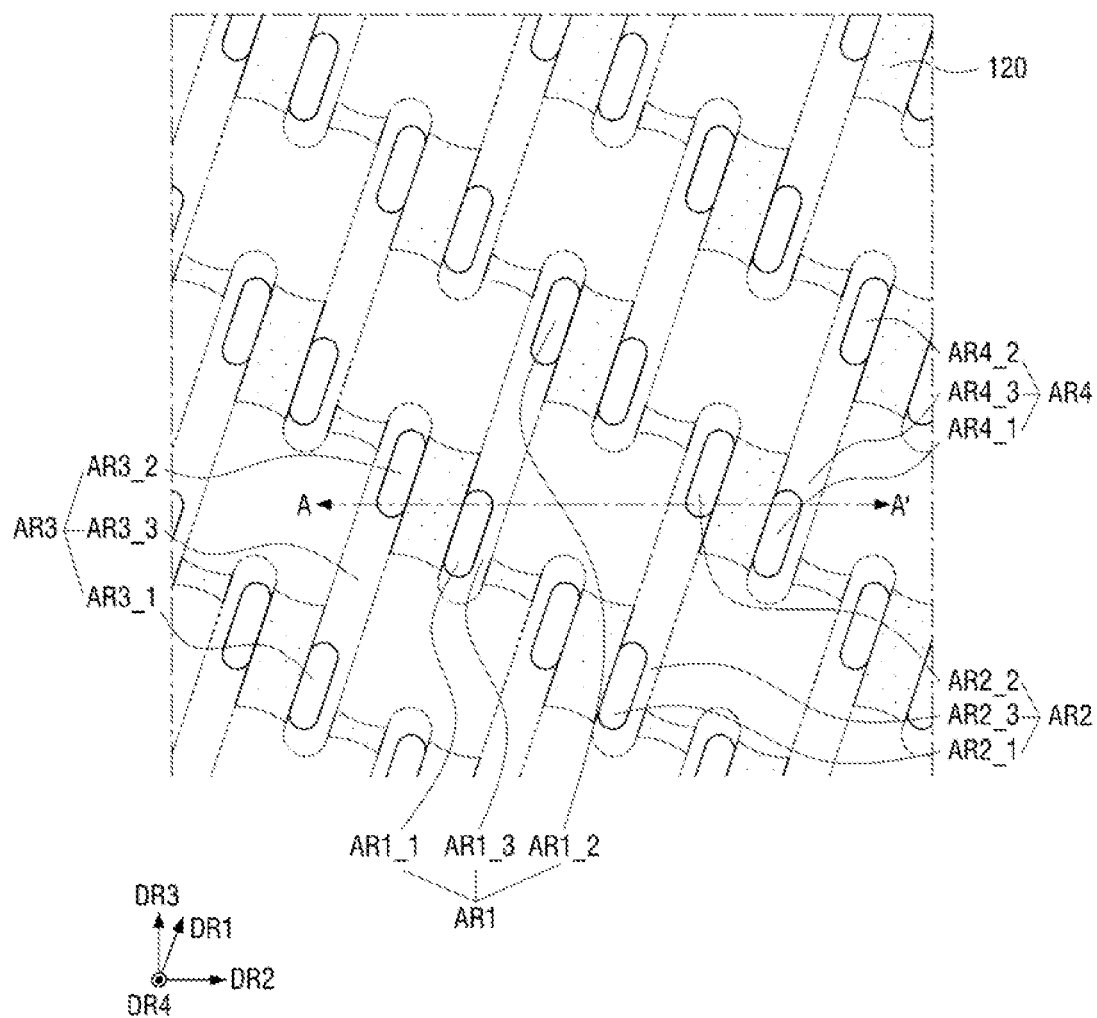
Figure 33:
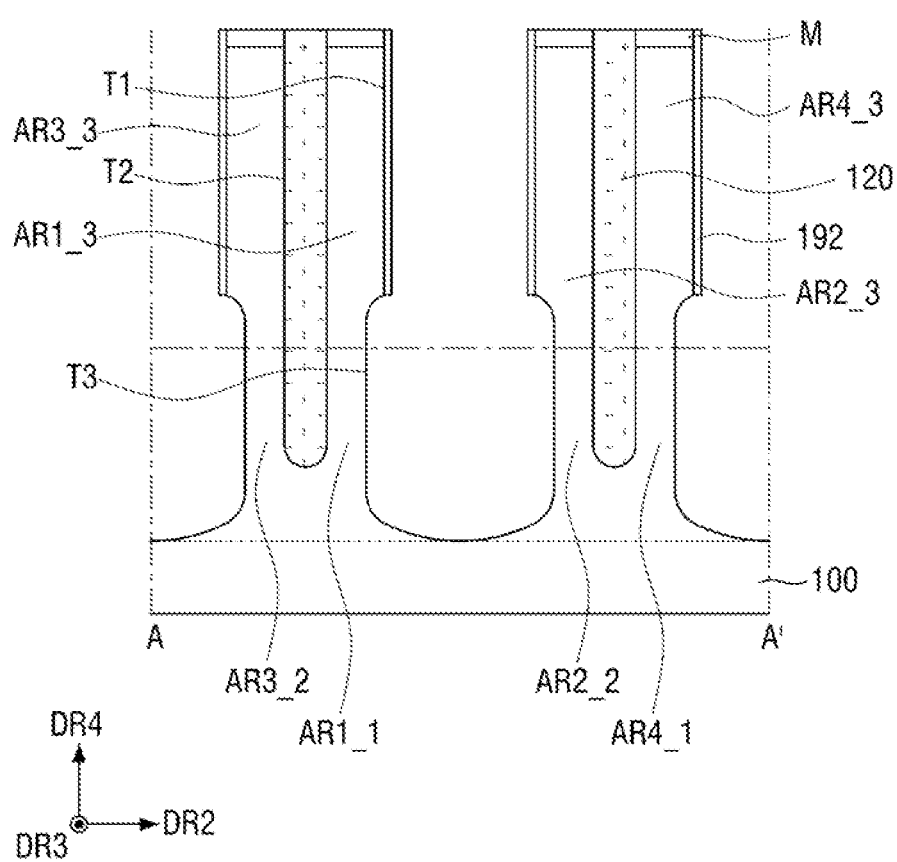

Referring to FIGS. 32 and 33, according to some embodiments, a part of the second insulating film 192 is removed, and the exposed side walls and bottom surface of the first trench T1 are etched, forming an undercut structure. Therefore, a third trench T3 is formed below the first trench T1. A width in the second direction DR2 of the first trench T1 is less than a width in the second direction DR2 of the third trench T3.

Figure 34:
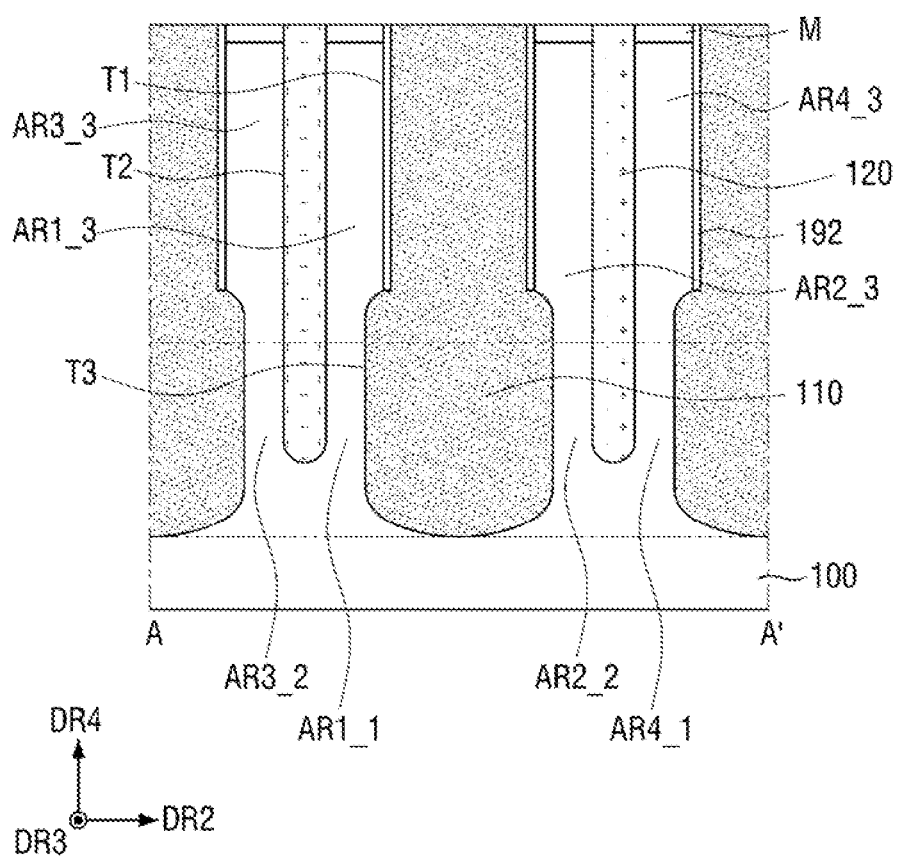

Referring to FIG. 34, according to some embodiments, a first element isolation region 110 is formed that fills the first trench T1 and the third trench T3.

Figure 35:
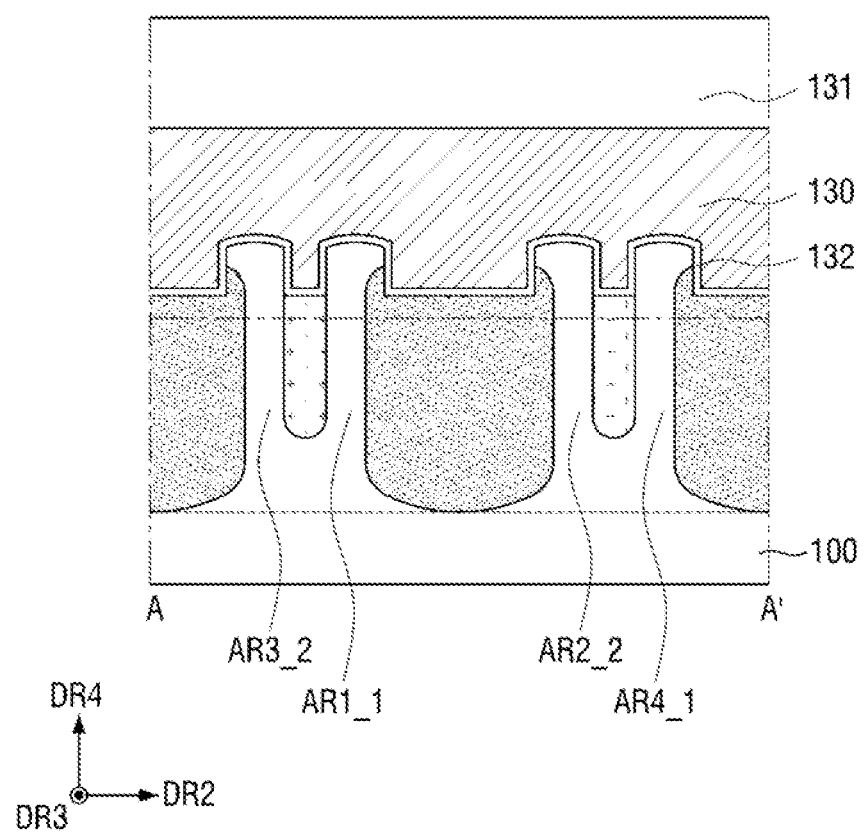

Referring to FIG. 35, according to some embodiments, the gate insulating film 132, the gate electrode 130 and the gate capping pattern 131 are formed inside each of the first element isolation region 110, the second element isolation region 120, and the first to fourth active regions AR1 to AR4, and extend in the second direction DR2.

Subsequently, additional processes may be performed to fabricate the semiconductor device shown in FIGS. 2 and 4.

In concluding the detailed description, those skilled in the art will appreciate that many variations and modifications may be made to exemplary embodiments without substantially departing from inventive principles of the present disclosure. Therefore, exemplary embodiments of the present disclosure are used in a generic and descriptive sense only and not for purposes of limitation.

What is claimed is:

1. A semiconductor device, comprising:
a substrate that extends in a first direction and a second direction that differs from the first direction;
an element isolation region disposed on the substrate;
a plurality of active regions disposed on the substrate, wherein the plurality of active regions include a first active region that is bounded by the element isolation region and extends in the first direction, wherein the first active region includes a first part and a second part, each disposed at a first level, and a third part disposed at a second level located in a third direction above the first level, wherein the third direction is perpendicular to a plane defined by the first direction and the second direction; and
a gate electrode disposed inside each of the element isolation region and the first active region and that extends in second direction,
wherein the second part of the first active region is spaced apart and separated in the first direction from the first part of the first active region, and the third part of the first active region contacts each of the first part and the second part of the first active region, and
wherein a first width in the second direction of the first part of the first active region is less than a second width in the second direction of the third part of the first active region.

2. The semiconductor device of claim 1, wherein the first active region further includes a fourth part that is disposed at a third level located below the first level and contacts each of the first part and the second part of the first active region.

3. The semiconductor device of claim 2, wherein the first width in the second direction of the first part of the first active region is less than a fourth width in the second direction of the fourth part of the first active region.

4. The semiconductor device of claim 1, wherein the plurality of active regions further include:
a second active region that is bounded by the element isolation region and extends in the first direction, wherein the second active region is spaced apart in the second direction from the first active region; and
a third active region that is bounded by the element isolation region and extends in the first direction, wherein the third active region is spaced apart in the second direction from each of the first and second active regions,
wherein the element isolation region includes a first element isolation region disposed between the first active region and the second active region, and a second element isolation region disposed between the first active region and the third active region.

5. The semiconductor device of claim 4, wherein a lower surface of the gate electrode disposed on the first element isolation region is coplanar with a lower surface of the gate electrode disposed on the second element isolation region.

6. The semiconductor device of claim 4,
wherein the lower surface of the gate electrode disposed on the first element isolation region includes a first lower surface and a second lower surface, and
wherein the first lower surface is adjacent to each of the first active region and the second active region, and the second lower surface extends between adjacent first lower surfaces.

7. The semiconductor device of claim 4, wherein
the second active region includes a first part and a second part that are disposed at the first level, and a third part disposed at the second level, and
the second part of the second active region is spaced apart in the first direction from the first part of the second active region, and the third part of the second active region contacts each of the first and second parts of the second active region.

8. The semiconductor device of claim 7, wherein a fifth width in the second direction of the first element isolation region disposed between the first part of the first active region and the second part of the second active region is greater than a sixth width in the second direction of the first element isolation region disposed between the third part of the first active region and the third part of the second active region.

9. The semiconductor device of claim 1,
wherein the first part of the first active region is spaced apart in the second direction from a first side wall of the third part of the first active region, and
wherein the second part of the first active region is spaced apart in the second direction from a second side wall of the third part opposite to the first side wall of the third part of the first active region.

10. The semiconductor device of claim 1,
wherein the element isolation region includes a first film, and a second film disposed inside the first film, and
wherein the first film and the second film include materials that differ from each other.

11. A semiconductor device, comprising:
an element isolation region;
a first active region that is bounded by the element isolation region and extends in a first direction, wherein the first active region includes a first part and a second part that are disposed at a first level, and a third part disposed at a second level located above the first level; and
a second active region that is bounded by the element isolation region and extends in the first direction, wherein the second active region is spaced apart in a second direction different from the first active region wherein the second direction differs from the first direction, wherein the second active region includes a first and a second part that are disposed at the first level, and a third part disposed at the second level, wherein the second part of the first active region is spaced apart in the first direction from the first part of the first active region, and the third part of the first active region contacts each of the first part and the second part of the first active region, wherein the second part of the second active region is spaced apart in the first direction from the first part of the second active region, and the third part of the second active region contacts each of the first part and the second part of the second active region, and wherein a first width in the second direction of the element isolation region between the first part of the first active region and the second part of the second active region is greater than a second width in the second direction of the element isolation region between the third part of the first active region and the third part of the second active region.

12. The semiconductor device of claim 11, wherein a third width in the second direction of the first part of the first active region is less than a fourth width in the second direction of the third part of the first active region.

13. The semiconductor device of claim 11,
wherein the first part of the first active region is spaced apart in the second direction from a first side wall of the third part of the first active region, and
wherein the second part of the first active region is spaced apart in the second direction from a second side wall of the third part opposite to the first side wall of the third part of the first active region.

14. The semiconductor device of claim 11, further comprising a third active region that is bounded by the element isolation region and extends in the first direction, wherein the third active region is spaced apart in the second direction from each of the first and second active regions, and
wherein the element isolation region includes a first element isolation region disposed between the first active region and the second active region, and a second element isolation region disposed between the first active region and the third active region.

15. The semiconductor device of claim 14, further comprising a gate electrode disposed inside each of the element isolation region, the first active region and the second active region, and that extends in the second direction, wherein a lower surface of the gate electrode disposed on the first element isolation region is located on a different plane from a lower surface of the gate electrode disposed on the second element isolation region.

16. A semiconductor device, comprising:
an element isolation region;
a first active region that is bounded by the element isolation region and extends in a first direction, wherein the first active region includes a first part and a second part, each disposed at a first level, a third part disposed at a second level located in a third direction above the first level, and a connection part that is disposed at the first level and that connects the first part of the first active region and the second part of the first active region; and
a gate electrode disposed inside each of the element isolation region and the first active region and that extends in a second direction that differs from the first direction,
wherein the third direction is perpendicular to a plane defined by the first direction and the second direction,
wherein the second part of the first active region is spaced apart and separated in the first direction from the first part of the first active region, and the third part of the first active region contacts each of the first part and the second part of the first active region, and
wherein a first width in the second direction of the first part of the first active region is less than a second width in the second direction of the third pan of the first active region, and is greater than a third width in the second direction of the connection part of the first active region.

* * * * *